(12) United States Patent
Mariani et al.

(10) Patent No.: US 9,245,987 B2
(45) Date of Patent: Jan. 26, 2016

(54) SEMICONDUCTOR DEVICES AND FABRICATION METHODS

(71) Applicant: Micron Technology, Inc., Boise, ID (US)

(72) Inventors: Marcello Mariani, Milan (IT); Carlo Pozzi, Briosco (IT)

(73) Assignee: Micron Technology, Inc., Boise, ID (US)

( * ) Notice: Subject to any disclaimer, the term of this patent is extended or adjusted under 35 U.S.C. 154(b) by 284 days.

(21) Appl. No.: 13/689,442

(22) Filed: Nov. 29, 2012

(65) Prior Publication Data

US 2014/0145238 A1 May 29, 2014

(51) Int. Cl.
*H01L 29/74* (2006.01)
*H01L 29/66* (2006.01)

(52) U.S. Cl.
CPC .......... *H01L 29/74* (2013.01); *H01L 29/66363* (2013.01)

(58) Field of Classification Search
CPC .......................... H01L 29/66363; H01L 29/74
USPC ........... 257/107, E21.131, E29.309, E29.262; 438/270, 478
See application file for complete search history.

(56) References Cited

U.S. PATENT DOCUMENTS

| | | | |
|---|---|---|---|
| 6,576,954 B2 | 6/2003 | Madson et al. | |
| 7,626,223 B2 | 12/2009 | Haller | |
| 7,855,415 B2 | 12/2010 | Challa et al. | |
| 2011/0193159 A1* | 8/2011 | Kujirai | 257/331 |
| 2011/0223731 A1 | 9/2011 | Chung | |
| 2011/0248334 A1* | 10/2011 | Sandhu et al. | 257/326 |
| 2011/0312138 A1 | 12/2011 | Yedinak et al. | |

* cited by examiner

*Primary Examiner* — Matthew Gordon
(74) *Attorney, Agent, or Firm* — Schwegman Lundberg & Woessner, P.A.

(57) ABSTRACT

Methods of fabricating vertical devices are described, along with apparatuses and systems that include them. In one such method, a vertical device is formed at least partially in a void in a first dielectric material and a second dielectric material. Additional embodiments are also described.

26 Claims, 22 Drawing Sheets

US 9,245,987 B2

SEMICONDUCTOR DEVICES AND FABRICATION METHODS

BACKGROUND

Non-volatile semiconductor memories (NVSMs) are widely used in many electronic devices such as personal digital assistants (PDAs), laptop computers, mobile phones and digital cameras, among others. Some of these memories have arrays of charge storage transistors, such as floating gate transistors.

A process flow for a vertical gated thyristor or a vertical metal oxide semiconductor (MOS) array includes the following. A first shallow trench isolation (STI) is formed in a first direction. A field oxide is then lowered to a level of silicon and a silicon nitride hard mask is removed. A new silicon nitride layer is deposited, and a second STI is formed in a second direction. The silicon, the silicon nitride and the silicon dioxide are etched at the same time. The trenches are then filled with silicon dioxide and a chemical-mechanical planarization (CMP) landing over the silicon nitride is performed. The silicon dioxide is etched back using a dry etch process. A vertical gate is formed on pillar sidewalls by forming metal spacers. Vertical gate recession, trench filling, CMP, nitride stripping and junction formation then occur. Both the silicon dioxide and the silicon are etched simultaneously to form the second STI trench. Photoresist and/or hard mask consumption will also occur. High aspect ratio pillars are doped from the top. A source region for a vertical MOS or a cathode region for a thyristor are formed by implanting n-type ions at the bottom of the second STI right after etching, and then the species is diffused to dope the bottom portion of the silicon pillars.

BRIEF DESCRIPTION OF THE DRAWINGS

Some embodiments are illustrated by way of example and not limitation in the figures of the accompanying drawings in which.

DETAILED DESCRIPTION

For the purposes of this document, an "apparatus" can refer to any of a number of structures, such as circuitry, a device or a system. A "tier of semiconductor material" can mean semiconductor material formed in the same plane, rank, row, or unit, such as in a horizontal, vertical, or sloped plane, row, rank, or unit of a structure.

Forming a vertical device such as a thyristor or a metal-oxide semiconductor field-effect transistor (MOSFET) with vertical gates from semiconductor materials presents several challenges. For example, an etch of more than one material at the same time may result in poorly defined features, such as trenches. Some of these challenges, as well as others, can be addressed by etching two different materials at different times and forming a semiconductor structure at least partially between the etched materials. A vertical device is a device that is grown or formed to have its largest dimension in a direction that is substantially orthogonal to a plane of a substrate on which it is grown or formed.

Figure 1:
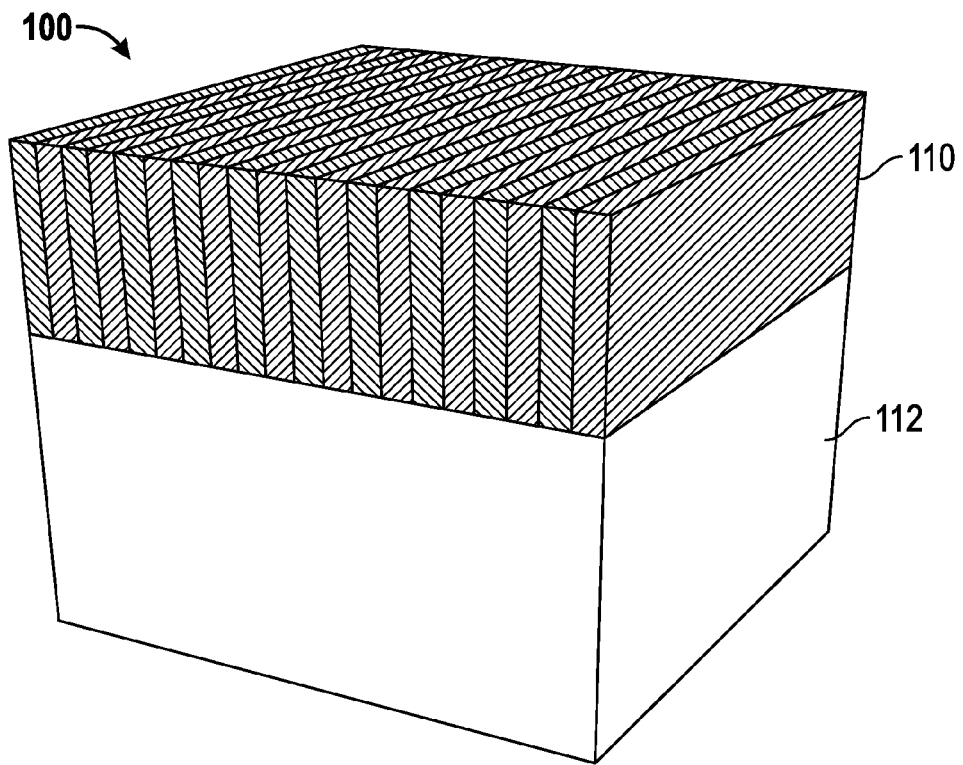
FIG. 1 is a perspective view of an apparatus in the form of a semiconductor construction according to various embodiments of the invention.

FIG. 1 is a perspective view of an apparatus in the form of a semiconductor construction 100 according to various embodiments of the invention. Elements in the semiconductor construction 100 will be identified by the same reference numerals throughout the drawings for purposes of brevity and clarity. In addition, acts may be described herein related to the formation of a single array of devices, but the acts may result in the formation of more than one array. Thus, it is understood that the acts described herein may be applied to multiple arrays of devices as well.

The semiconductor construction 100 includes a first dielectric such as silicon nitride ($Si_3N_4$) 110 deposited on a substrate 112. The silicon nitride 110 may be separated from the substrate 112 by silicon dioxide ($SiO_2$) (not shown) as a buffer according to various embodiments of the invention. The substrate 112 may comprise doped silicon such as p-type silicon or n-type silicon or undoped silicon. The substrate 112 may also be doped to form source regions or cathode regions (not shown).

Figure 2:
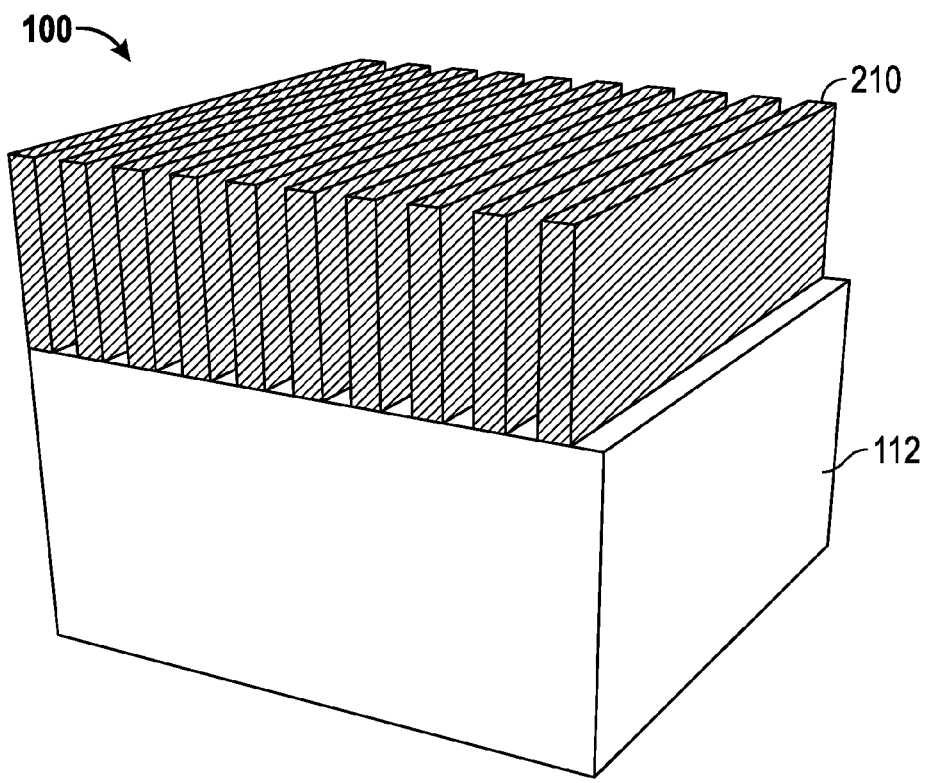
FIGS. 2-11 are perspective views of various stages of a semiconductor construction according to various embodiments of the invention.

FIG. 2 is a perspective view of the semiconductor construction 100 according to various embodiments of the invention. Here, the silicon nitride 110 is etched in a first direction to leave walls of silicon nitride 210 on the substrate 112 separated from each other by trenches.

Figure 3:
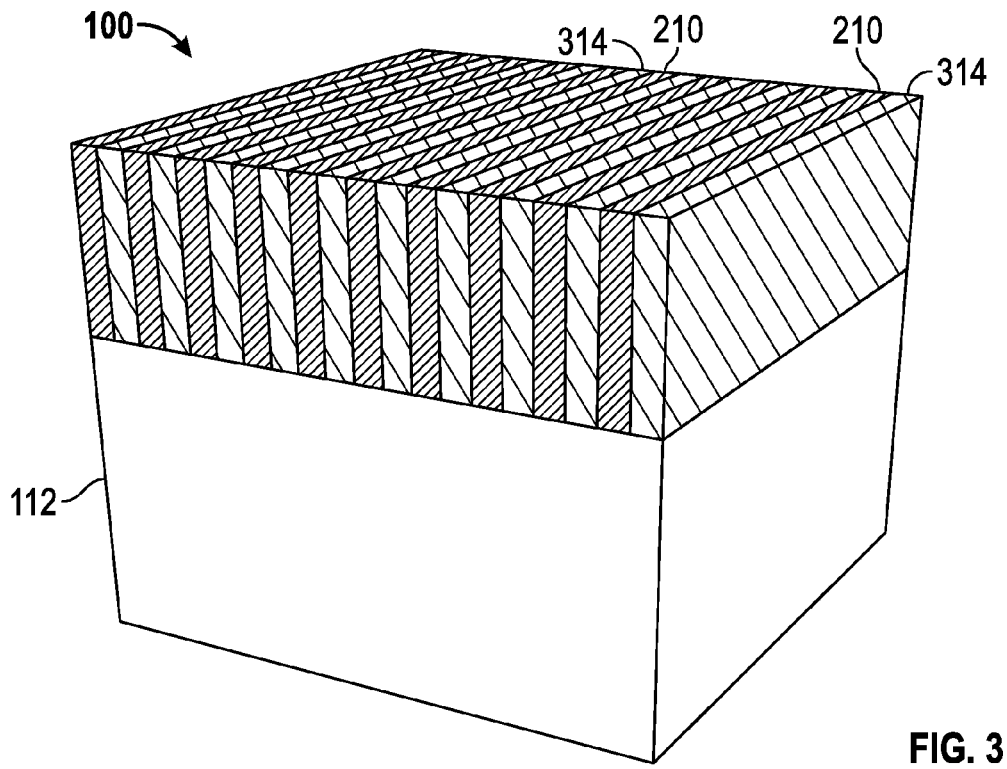

FIG. 3 is a perspective view of the semiconductor construction 100 according to various embodiments of the invention. The trenches between the walls of silicon nitride 210 are now filled with a second dielectric such as silicon dioxide to form walls of silicon dioxide 314. The semiconductor construction 100 can be subjected to planarization such as chemical-mechanical planarization (CMP) that stops at the walls of silicon nitride 210.

Figure 4:
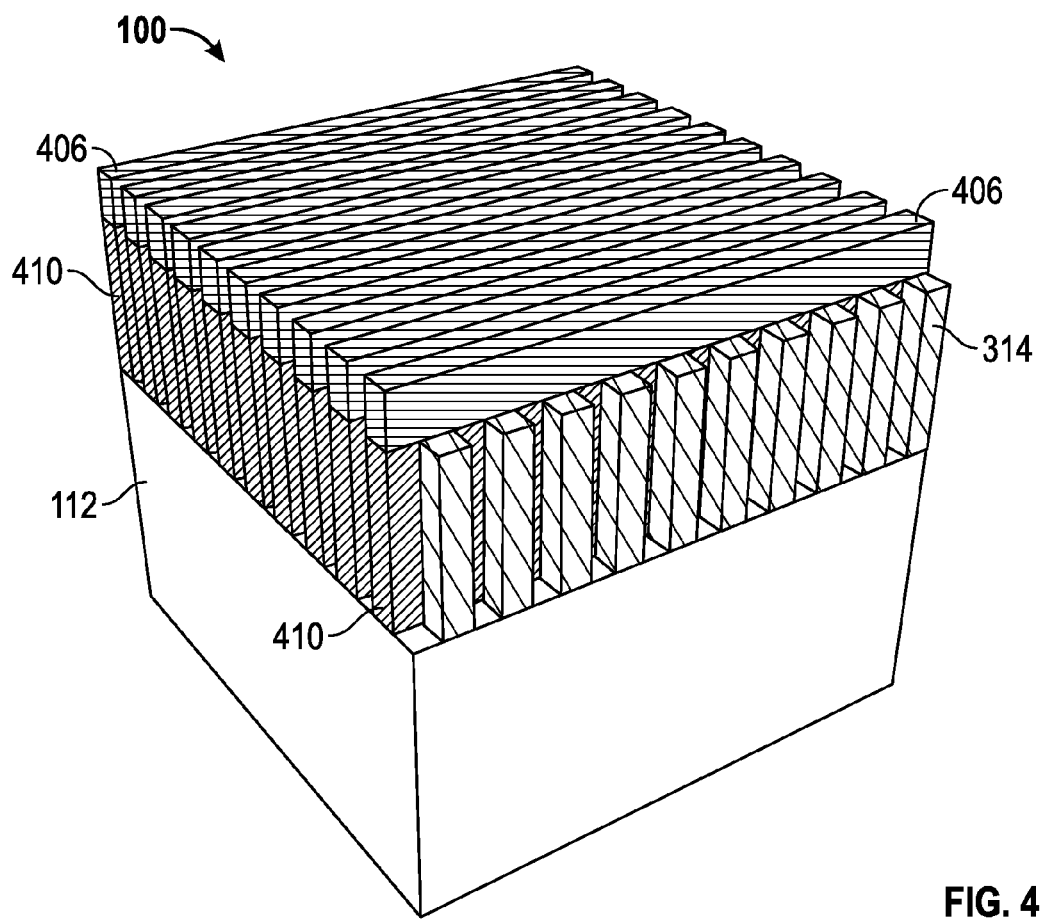

FIG. 4 is a perspective view of the semiconductor construction 100 according to various embodiments of the invention. The semiconductor construction 100 in FIG. 4 is rotated 90 degrees with respect to the semiconductor construction 100 in FIG. 3. A mask 406 can be formed (e.g., exposed) over the semiconductor construction 100, the mask 406 comprising walls separated by trenches that are substantially orthogonal to the walls of silicon nitride 210. The walls of silicon nitride 210 are etched to the substrate 112 in areas between the walls of the mask 406 and between the walls of silicon dioxide 314. The walls of silicon nitride 210 are etched without etching the silicon dioxide 314. The mask 406 is then removed. Portions of the walls of silicon nitride 210 are removed during the etch, leaving pillars of silicon nitride 410.

Figure 5:
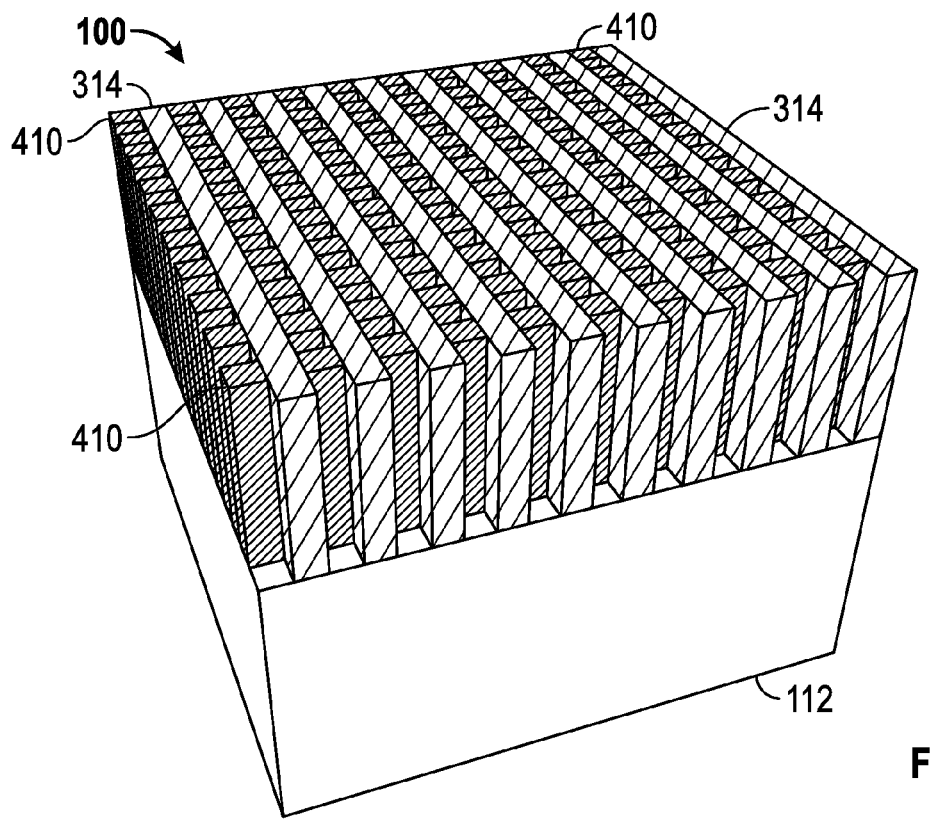

FIG. 5 is a perspective view of the semiconductor construction 100 according to various embodiments of the invention. The walls of silicon dioxide 314 and the pillars of the silicon nitride 410 between the walls of silicon dioxide 314 remain following the etch of the walls of the silicon nitride 210 and the removal of the mask 416. Voids between the walls of silicon dioxide 314 and the pillars of the silicon nitride 410 may extend to the substrate 112.

Figure 6:
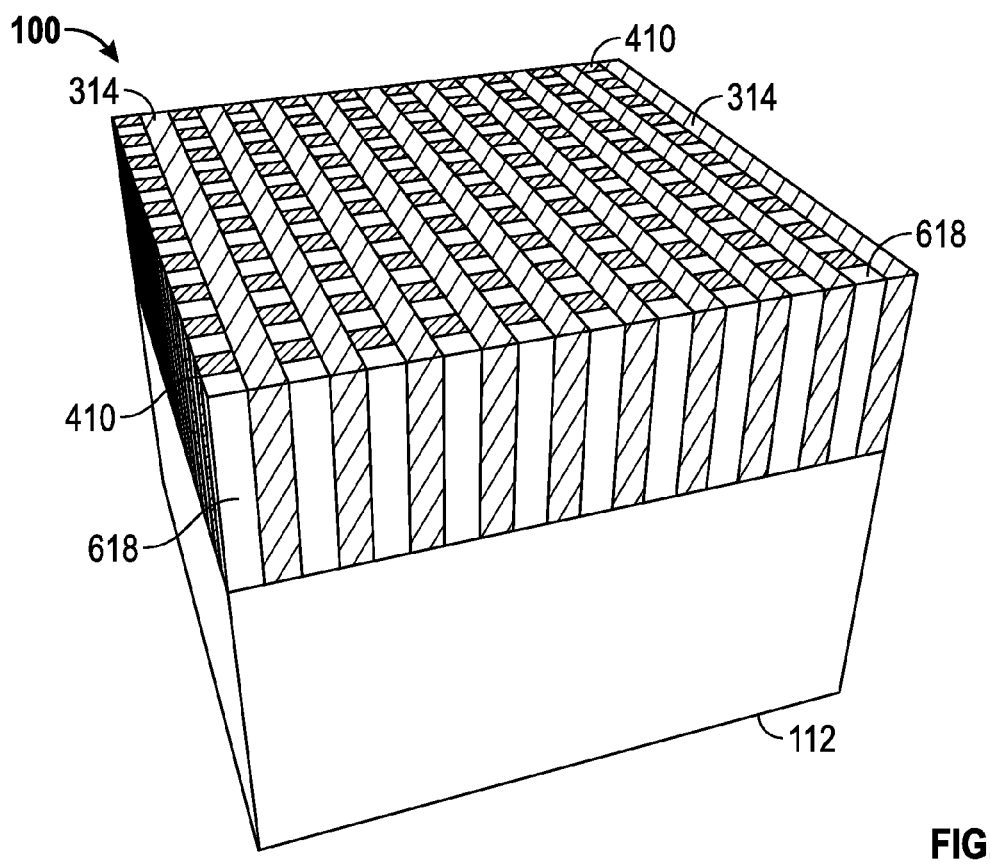

FIG. 6 is a perspective view of the semiconductor construction 100 according to various embodiments of the invention. Pillars of epitaxial silicon 618 are grown on the exposed silicon of the substrate 112 in the voids between the walls of silicon dioxide 314 and the pillars of the silicon nitride 410. The pillars of epitaxial silicon 618 are grown in contact with the walls of silicon dioxide 314 in a first direction and in contact with the pillars of the silicon nitride 410 in a second direction. The pillars of epitaxial silicon 618 may comprise selective epitaxial grown (SEG) silicon. The growth of the pillars of epitaxial silicon 618 is self-aligned. The pillars of epitaxial silicon 618 comprise single-crystal silicon having the same crystal size and orientation as the silicon of the substrate 112. The pillars of epitaxial silicon 618 may be separated from the silicon nitride 410 by spacers of silicon dioxide (not shown).

The pillars of epitaxial silicon 618 can be doped by in situ doping while they are being grown (not shown) to form p-type regions and/or n-type regions of vertical thyristors or MOSFETs. The pillars of epitaxial silicon 618 can also be doped by ion implantation after being formed. The semiconductor construction 100 can be subjected to planarization such as CMP that stops at the pillars of silicon nitride 410. The growth of the pillars of epitaxial silicon 618 can be stopped before the pillars of epitaxial silicon 618 reach the height of the pillars of silicon nitride 410, in which case the planarization may not be performed. The pillars of epitaxial silicon 618 are separated from each other by two different dielectric materials, the pillars of silicon nitride 410 in a first direction and the walls of silicon dioxide 314 in a second direction.

Figure 7:
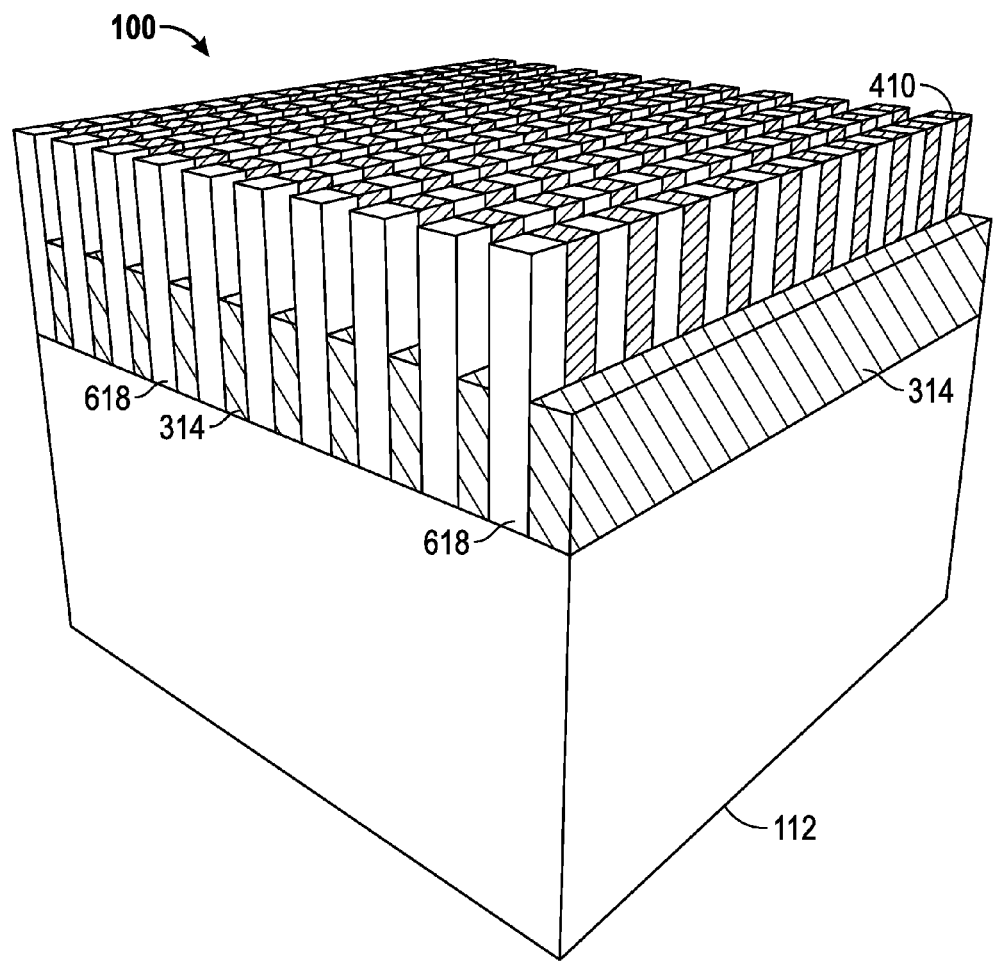

FIG. 7 is a perspective view of the semiconductor construction 100 according to various embodiments of the invention. The walls of silicon dioxide 314 are recessed by an etch that is self-aligned to set a position of vertical gates in the semiconductor construction 100. The walls of silicon dioxide 314 are recessed without a mask when the etch is selective.

Figure 8:
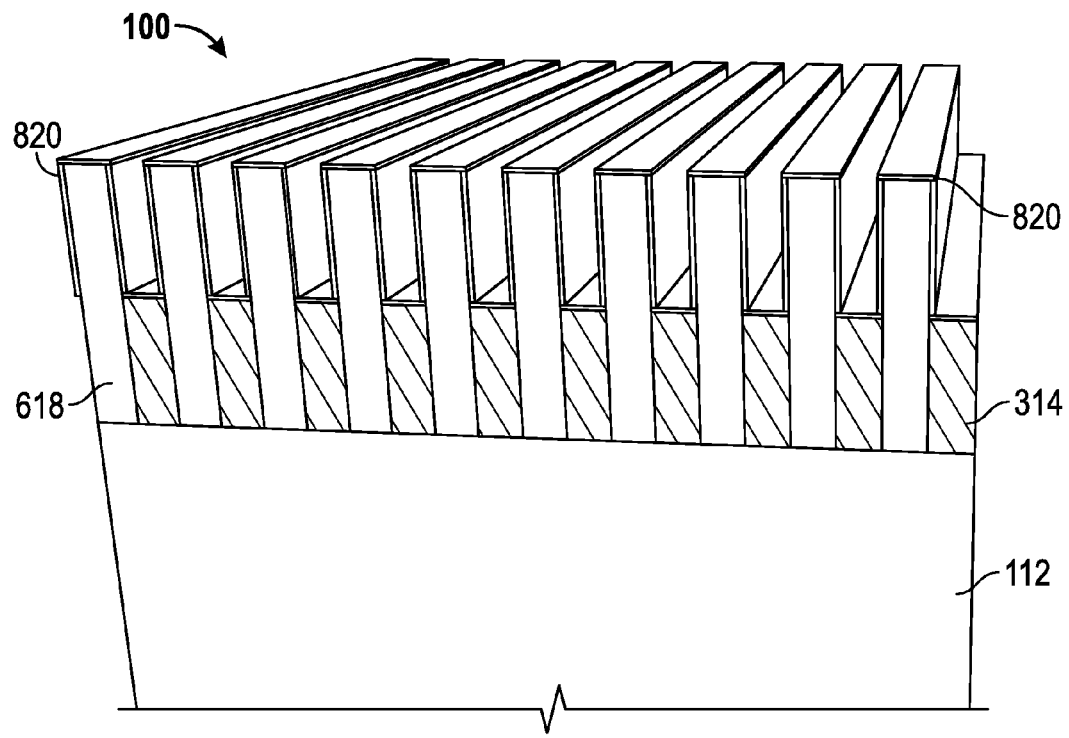

FIG. 8 is a perspective view of the semiconductor construction 100 according to various embodiments of the invention. A gate oxide 820 is deposited on the pillars of silicon nitride 410, the pillars of epitaxial silicon 618 and the walls of silicon dioxide 314. The gate oxide 820 may comprise silicon dioxide. The gate oxide 820 may also be thermally grown on the pillars of silicon nitride 410 and the pillars of epitaxial silicon 618.

Figure 9:
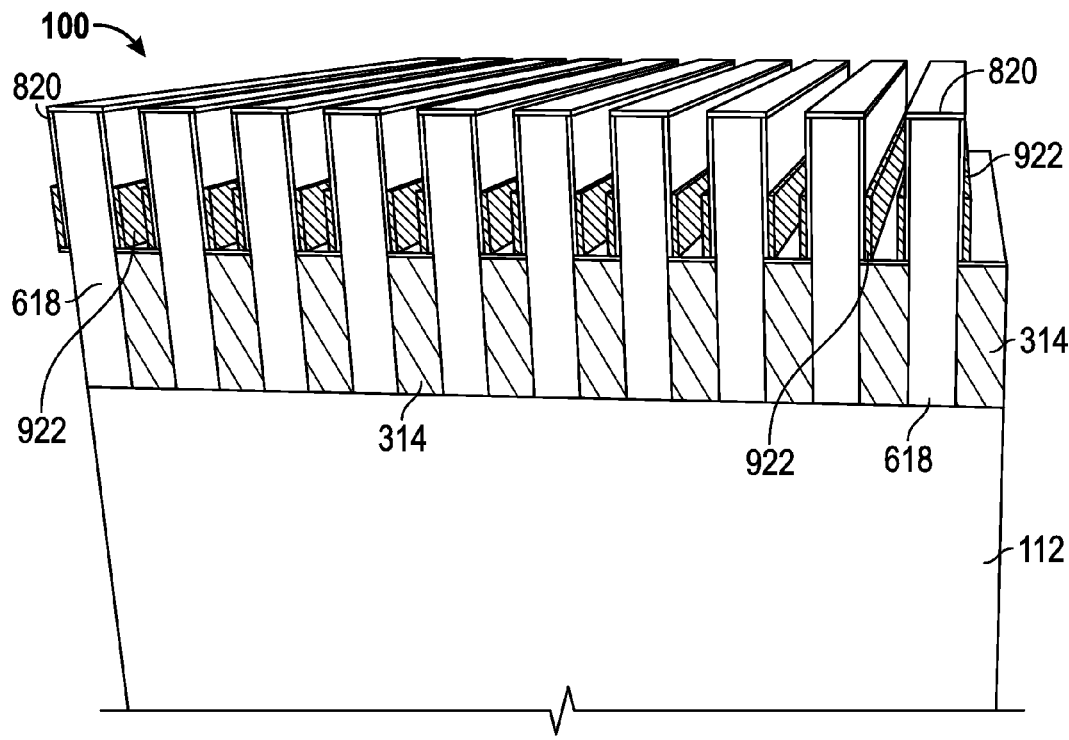

FIG. 9 is a perspective view of the semiconductor construction 100 according to various embodiments of the invention. Vertical metal gates 922 are formed on the gate oxide 820 with a spacer etch. A conformal layer of metal is deposited on the gate oxide 820. The metal may comprise titanium nitride (TiN). The spacer etch then removes the metal from horizontal surfaces and recesses the metal to leave the vertical metal gates 922 on the gate oxide 820.

Figure 10:
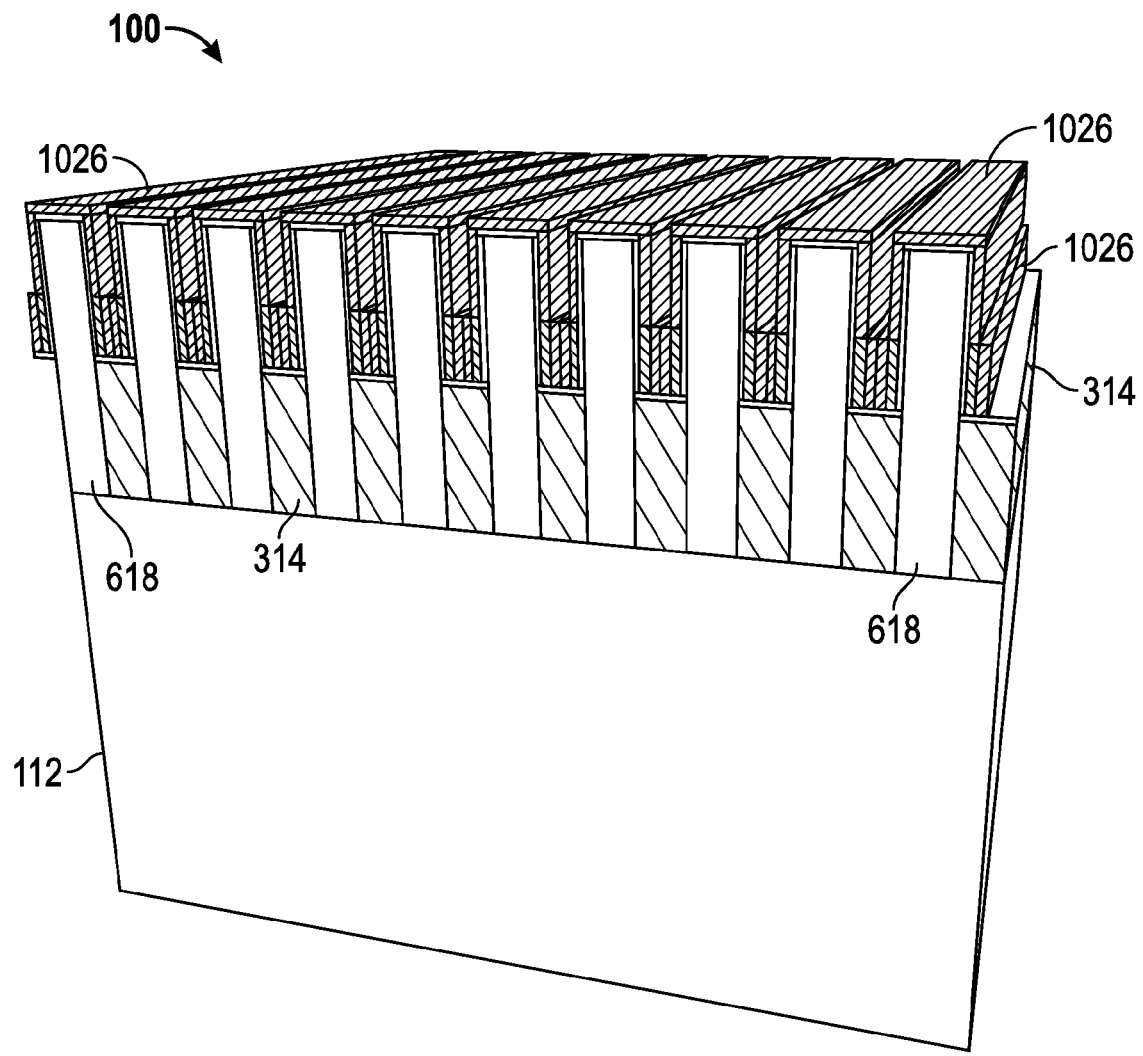

FIG. 10 is a perspective view of the semiconductor construction 100 according to various embodiments of the invention. Silicon nitride 1026 is formed over the metal gates 922 and the gate oxide 820.

Figure 11:
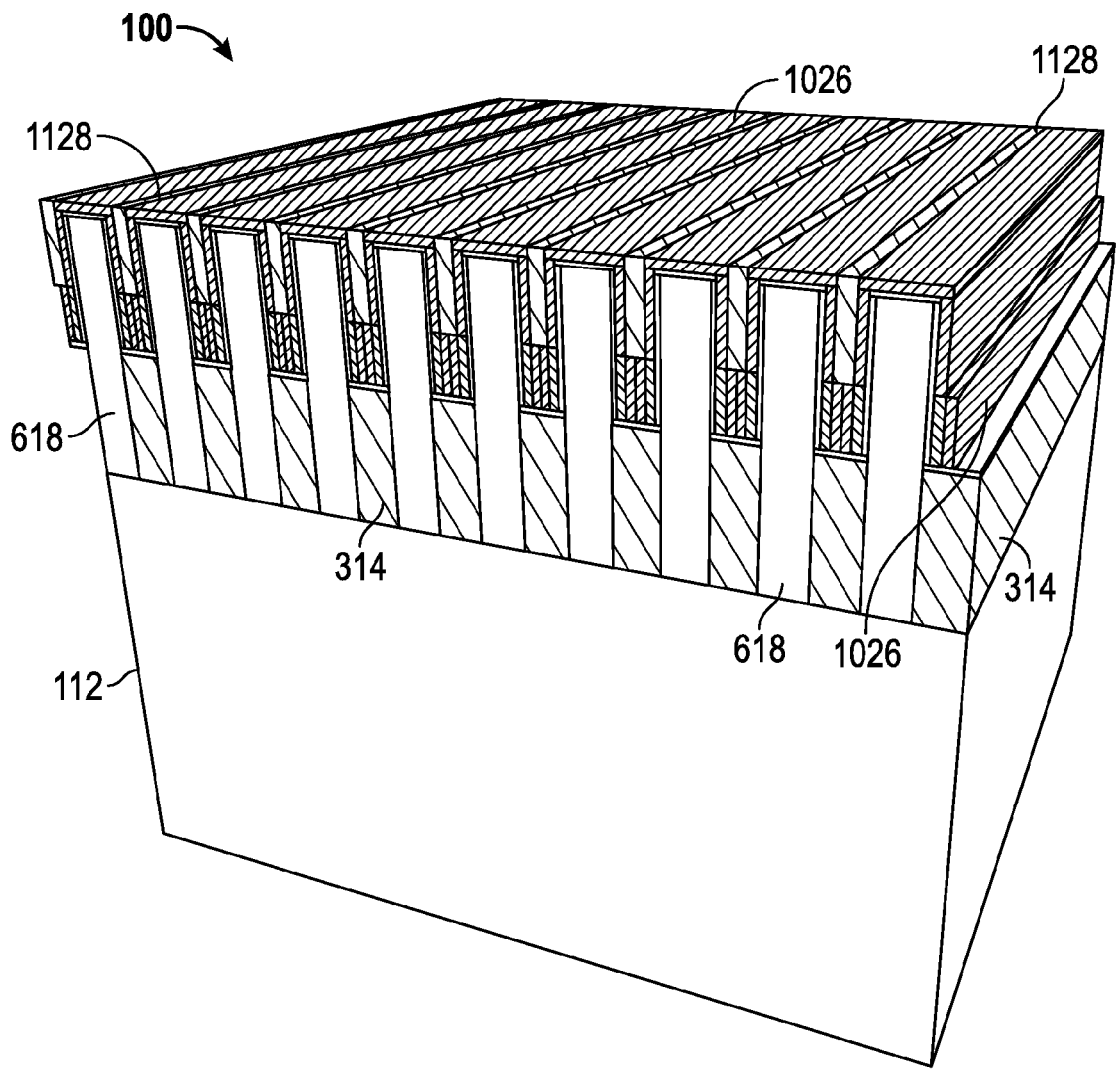

FIG. 11 is a perspective view of the semiconductor construction 100 according to various embodiments of the invention. Voids in the semiconductor construction over the metal gates 922 and the silicon nitride 1026 are filled with silicon dioxide 1128. The semiconductor construction 100 can be subjected to planarization such as CMP that stops at the silicon nitride 1026.

Figure 12:
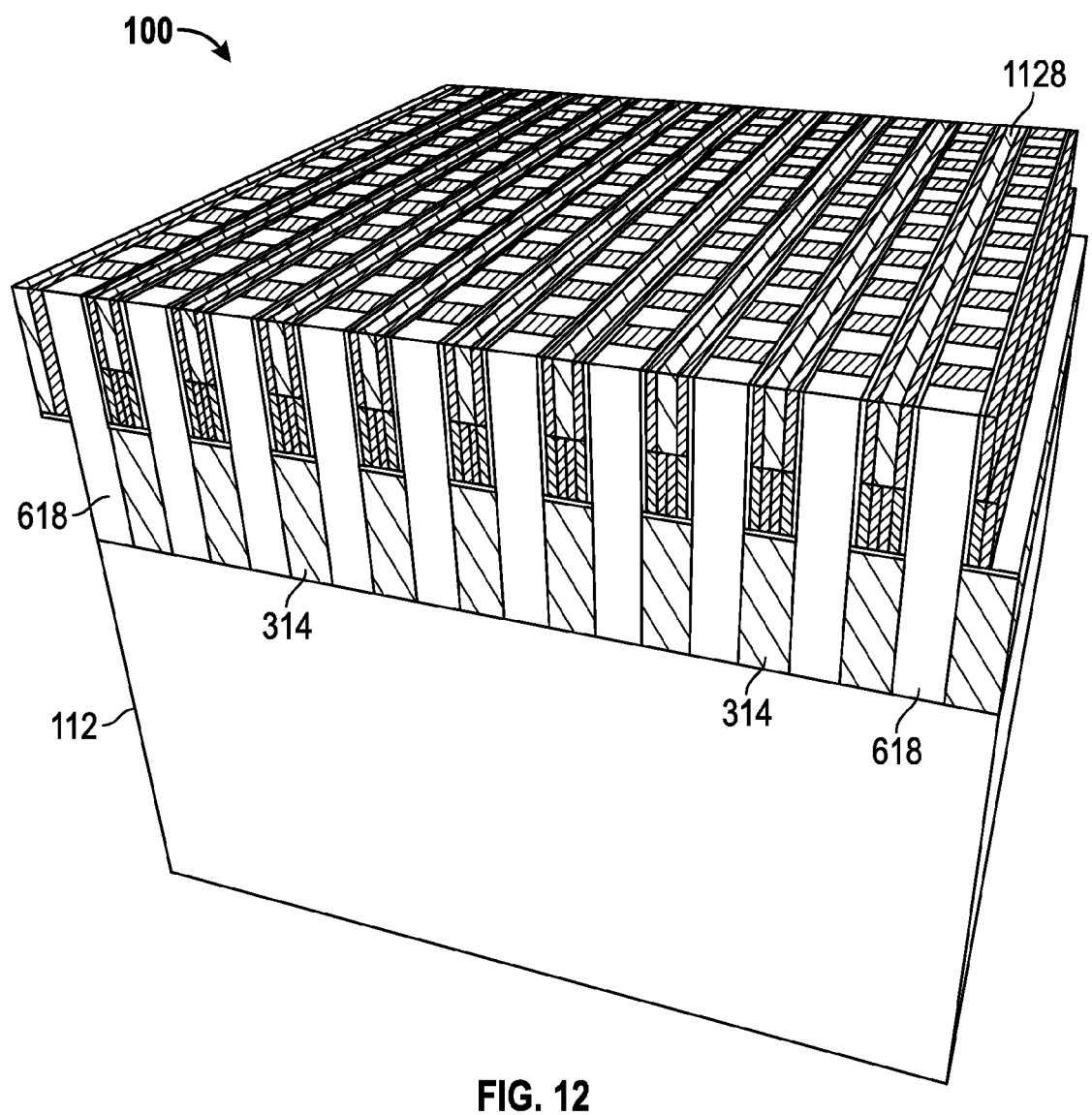
FIG. 12 is a perspective view of a semiconductor construction according to various embodiments of the invention.

FIG. 12 is a perspective view of the semiconductor construction 100 according to various embodiments of the invention. The silicon dioxide 1128 is recessed with respect to the pillars of epitaxial silicon 618 by an etch. Portions of the silicon nitride 1026 are removed from tops of the pillars of epitaxial silicon 618 by an etch. The semiconductor construction 100 shown in FIG. 12 comprises an array of devices that may comprise vertical thyristors or MOSFETs or other devices according to various embodiments of the invention. The pillars of epitaxial silicon 618 can be doped to form vertical transistors or thyristors.

Figure 12A:
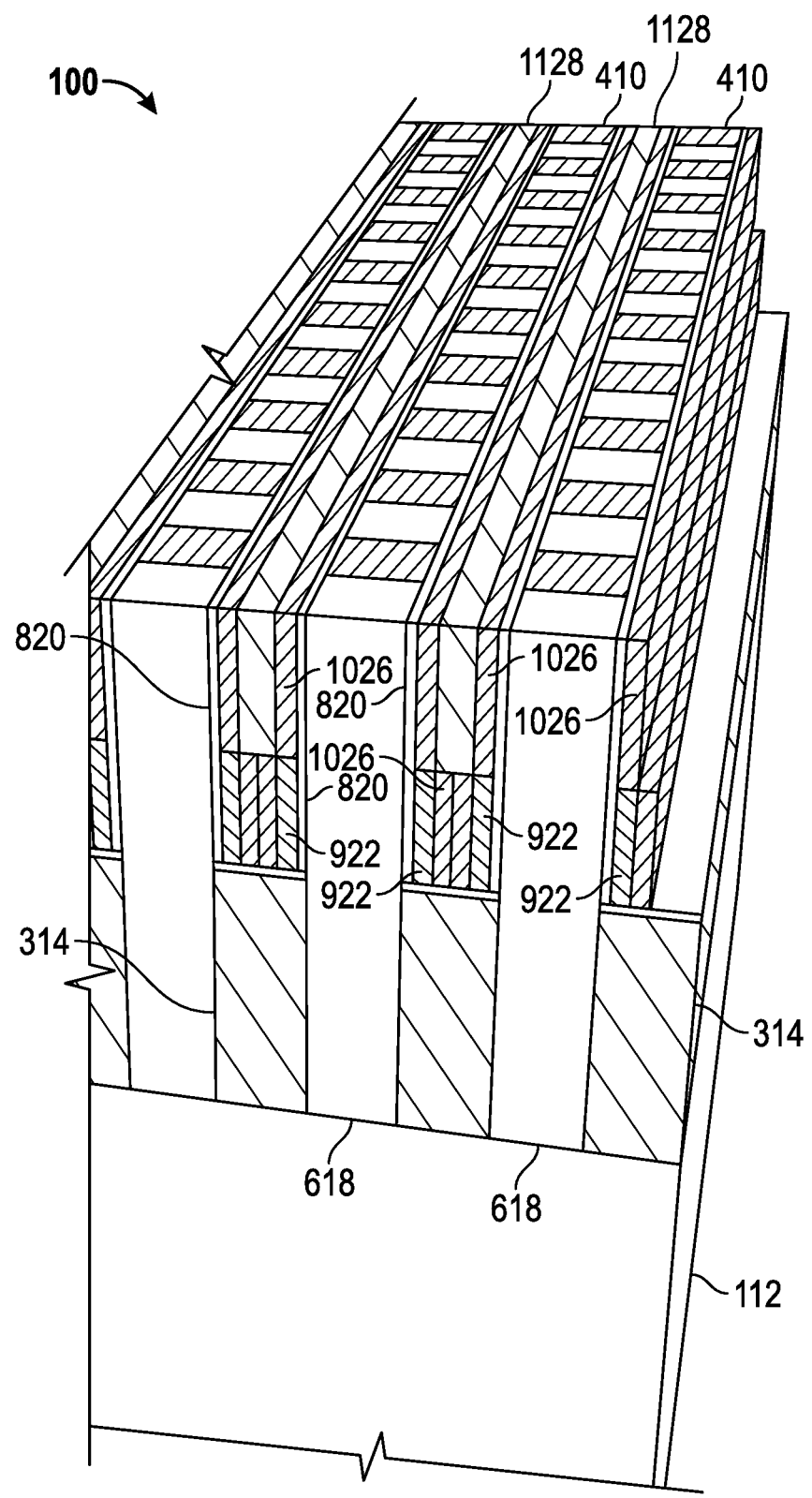
FIG. 12A is a perspective view of a portion of the semiconductor construction shown in FIG. 12 according to various embodiments of the invention.

FIG. 12A is a perspective view of a portion of the semiconductor construction 100 shown in FIG. 12 according to various embodiments of the invention. FIG. 12A illustrates the substrate 112, the pillars of silicon nitride 410, the walls of silicon dioxide 314, the pillars of epitaxial silicon 618, the gate oxide 820, the metal gates 922, the silicon nitride 1026 and the silicon dioxide 1128.

Figure 13:
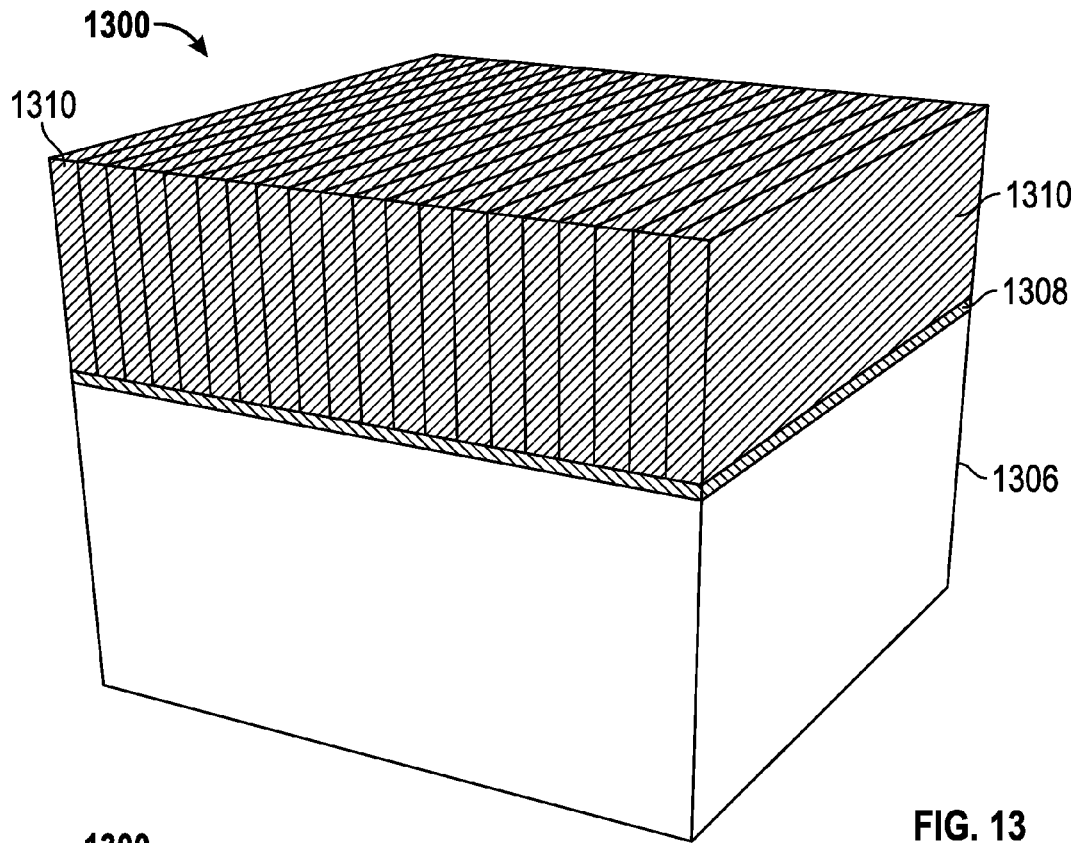
FIG. 13 is a perspective view of an apparatus in the form of a semiconductor construction according to various embodiments of the invention.

FIG. 13 is a perspective view of an apparatus in the form of a semiconductor construction 1300 according to various embodiments of the invention. Elements in the semiconductor construction 1300 will be identified by the same reference numerals throughout the drawings for purposes of brevity and clarity. In addition, acts may be described herein related to the formation of a single array of devices, but the acts may result in the formation of more than one array. Thus, it is understood that the acts described herein may be applied to multiple arrays of devices as well.

The semiconductor construction 1300 includes a substrate 1306 with a region that is doped with an n-type dopant to form an n-type region 1308. The n-type region 1308 is continuous across one surface of the substrate 1306 and comprises a common cathode region for a thyristor or a source region for MOSFETs. The substrate 1306 may comprise silicon and may be further doped with a p-type dopant or an n-type dopant or be undoped. A first dielectric such as silicon nitride 1310 deposited on the n-type region 1308. The n-type region 1308 may be a p-type region 1308 to form alternative devices according to various embodiments of the invention.

Figure 14:
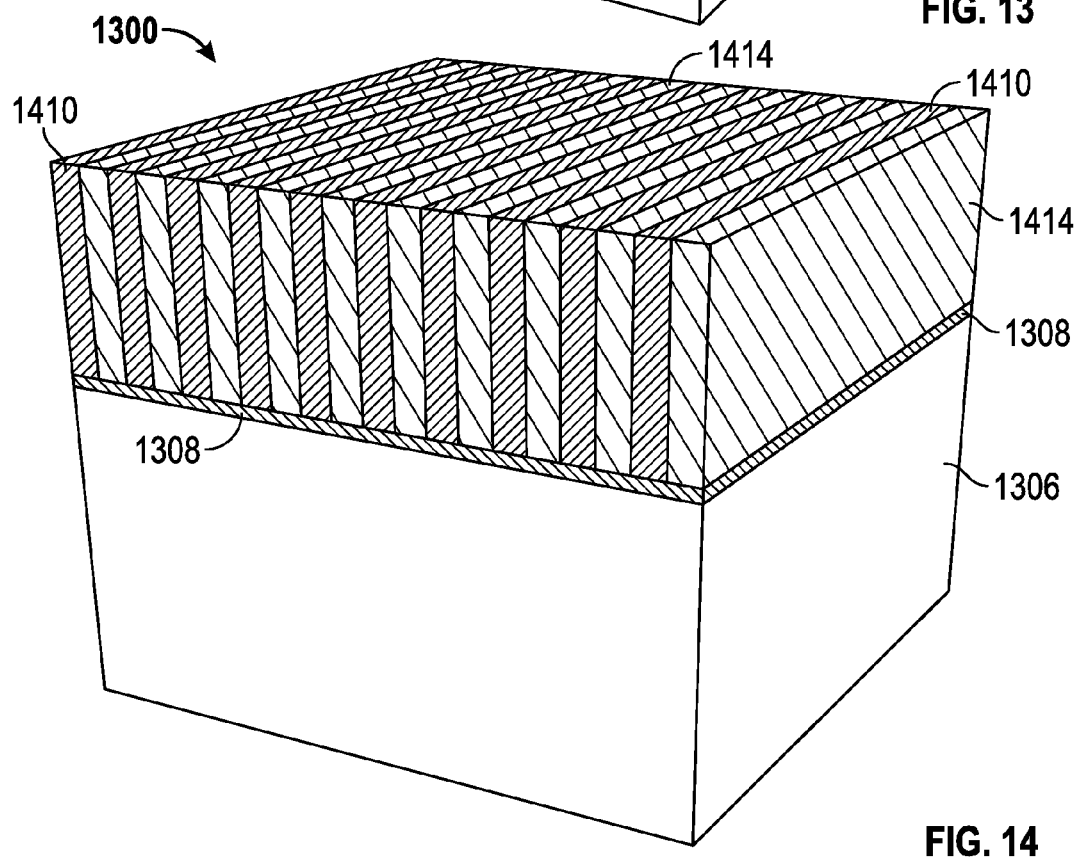
FIGS. 14-15 are perspective views of various stages of a semiconductor construction according to various embodiments of the invention.

FIG. 14 is a perspective view of the semiconductor construction 1300 according to various embodiments of the invention. The silicon nitride 1310 is etched in a first direction to leave walls of silicon nitride 1410 on the n-type region 1308 separated from each other by trenches. The etch stops at the n-type region 1308. The trenches between the walls of silicon nitride 1410 are filled with a second dielectric such as silicon dioxide to form walls of silicon dioxide 1414. The semiconductor construction 1300 can be subjected to planarization such as CMP that stops at the walls of silicon nitride 1410.

Figure 15:
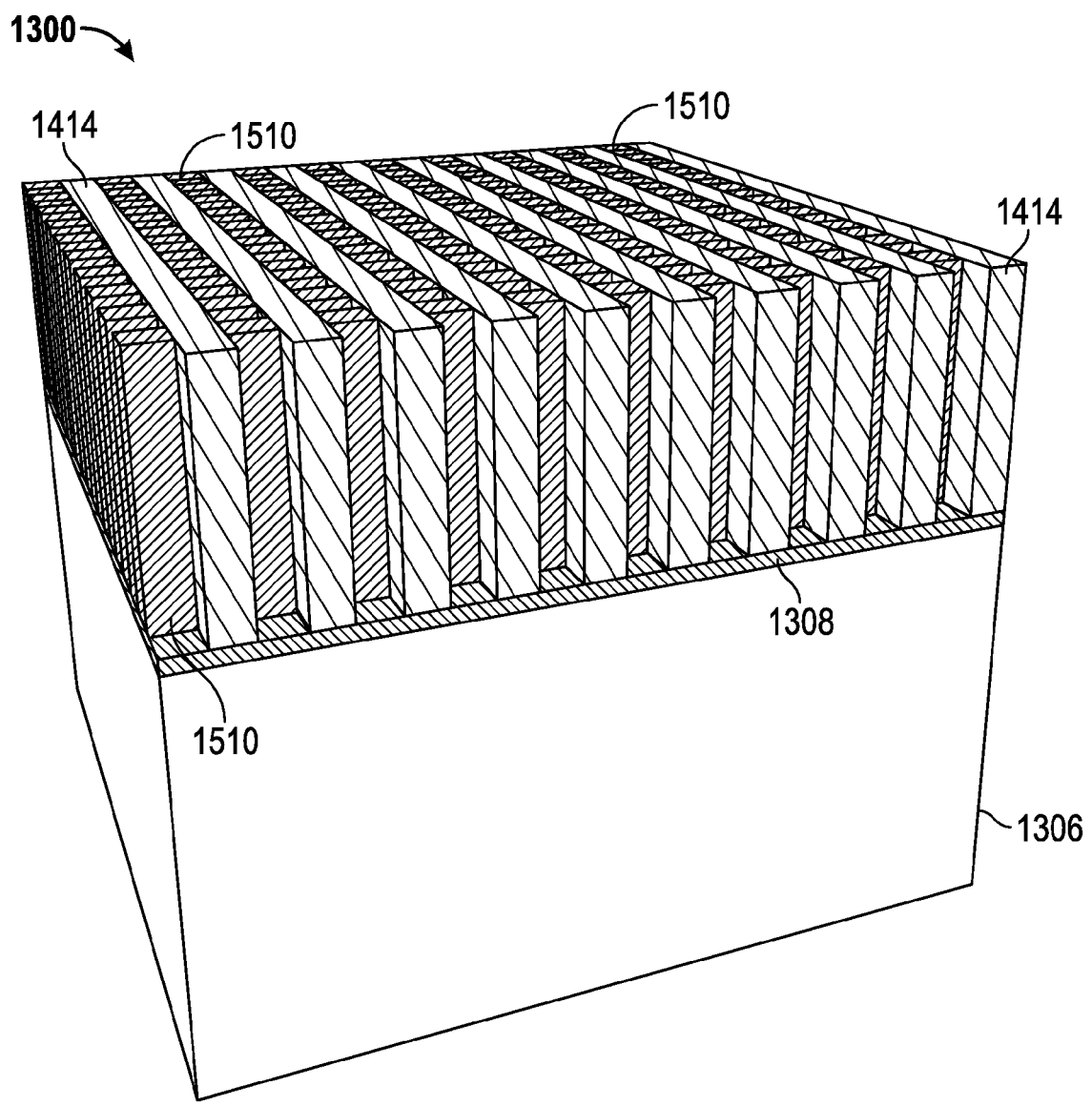

FIG. 15 is a perspective view of the semiconductor construction 1300 according to various embodiments of the invention. The semiconductor construction 1300 in FIG. 15 is rotated 90 degrees with respect to the semiconductor construction 1300 in FIG. 14. A mask (not shown) can be formed (e.g., exposed) over the semiconductor construction 1300, the mask comprising walls separated by trenches that are substantially orthogonal to the walls of silicon nitride 1410. The walls of silicon nitride 1410 are etched to the n-type region 1308 in areas between the walls of the mask and the walls of silicon dioxide 1414. The mask is then removed. Portions of the walls of silicon nitride 1410 are removed during the etch, leaving pillars of silicon nitride 1510. The walls of silicon dioxide 1414 and the pillars of the silicon nitride 1510 in the trenches between the walls of silicon dioxide 1414 remain following the etch and the removal of the mask. Voids between the walls of silicon dioxide 1414 and the pillars of the silicon nitride 1510 may extend to the n-type region 1308.

Figure 16:
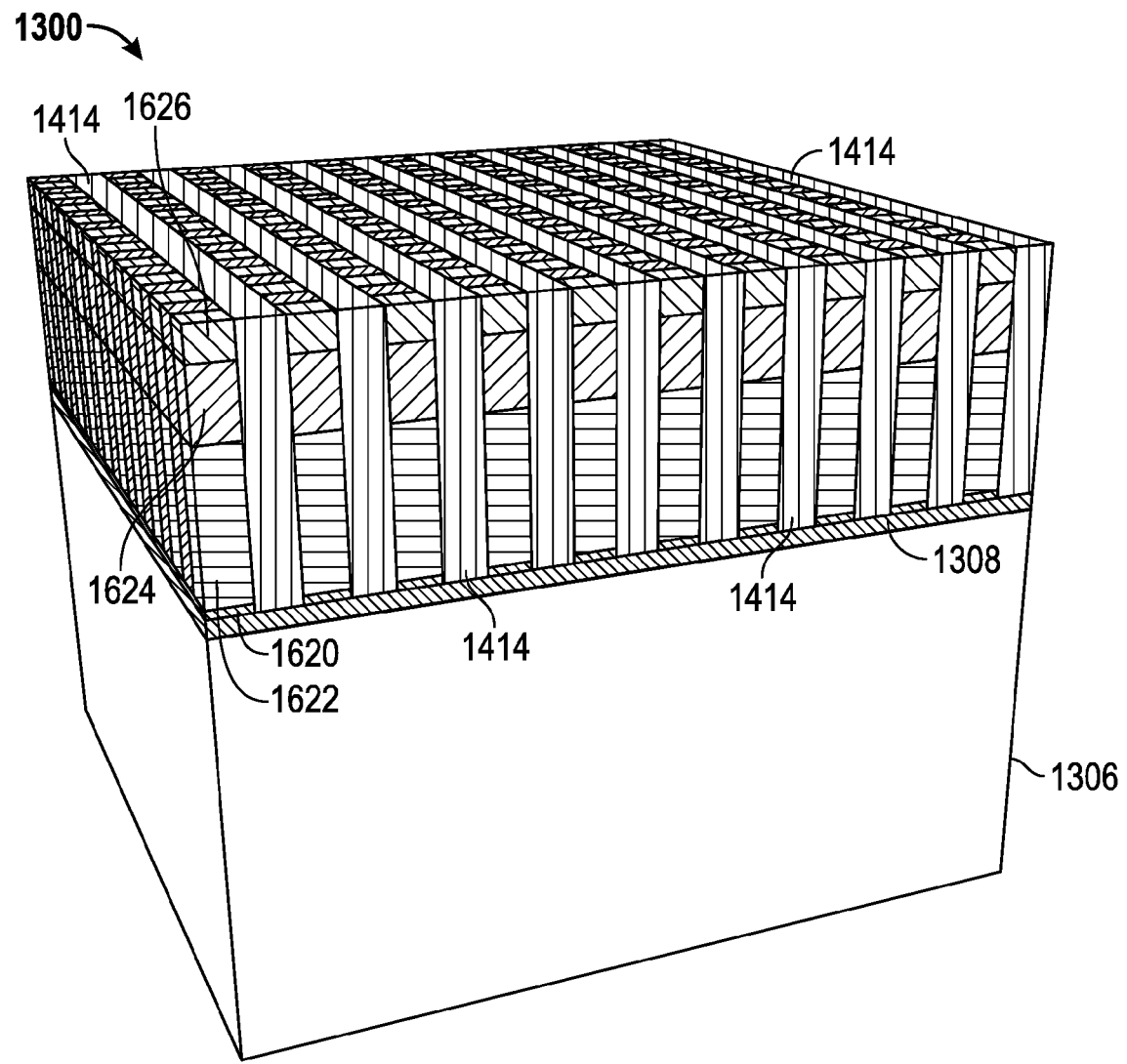
FIG. 16 is a perspective view of a semiconductor construction according to various embodiments of the invention.

FIG. 16 is a perspective view of the semiconductor construction 1300 according to various embodiments of the invention. Pillars of epitaxial silicon are grown on the exposed n-type region 1308 in the voids between the walls of silicon dioxide 1414 and pillars of the silicon nitride 1510. The pillars of epitaxial silicon comprise four differently doped regions described below. The pillars of epitaxial silicon may comprise SEG silicon. The growth of the pillars of epitaxial silicon is self-aligned. The pillars of epitaxial silicon comprise single-crystal silicon having the same crystal size and orientation as the silicon of the n-type region 1308.

The pillars of epitaxial silicon are doped in situ while being grown to form four differently doped regions of a thyristor. Each pillar of epitaxial silicon includes an n-type cathode region 1620 that is in contact with the n-type region 1308 in the substrate 1306. A p-type pbase region 1622 is formed on the cathode region 1620. An n-type nbase region 1624 is formed on the pbase region 1622. A p-type anode region 1626 is formed on the nbase region 1624. Each of the pillars of epitaxial silicon include the cathode region 1620, the pbase region 1622, the nbase region 1624 and the anode region 1626 to form a thyristor. All of the pillars of epitaxial silicon are in contact with the n-type region 1308, which comprises a common cathode region.

The pillars of epitaxial silicon may be grown without doping and thereafter be doped with ion implantation. The pillars of epitaxial silicon may also be grown with some in situ doping and some ion implantation according to various embodiments of the invention. The pillars of epitaxial silicon can be formed with more or fewer p-type regions and/or n-type regions for different devices such as MOSFETs. The semiconductor construction 1300 can be subjected to planarization such as CMP that stops at the pillars of silicon nitride 1510. The pillars of epitaxial silicon are separated from each other by two different dielectrics, the pillars of silicon nitride 1510 in a first direction and the walls of silicon dioxide 1414 in a second direction. The semiconductor construction 1300 shown in FIG. 16 comprises an array of devices that may be vertical thyristors or MOSFETs or other devices according to various embodiments of the invention.

Figure 16A:
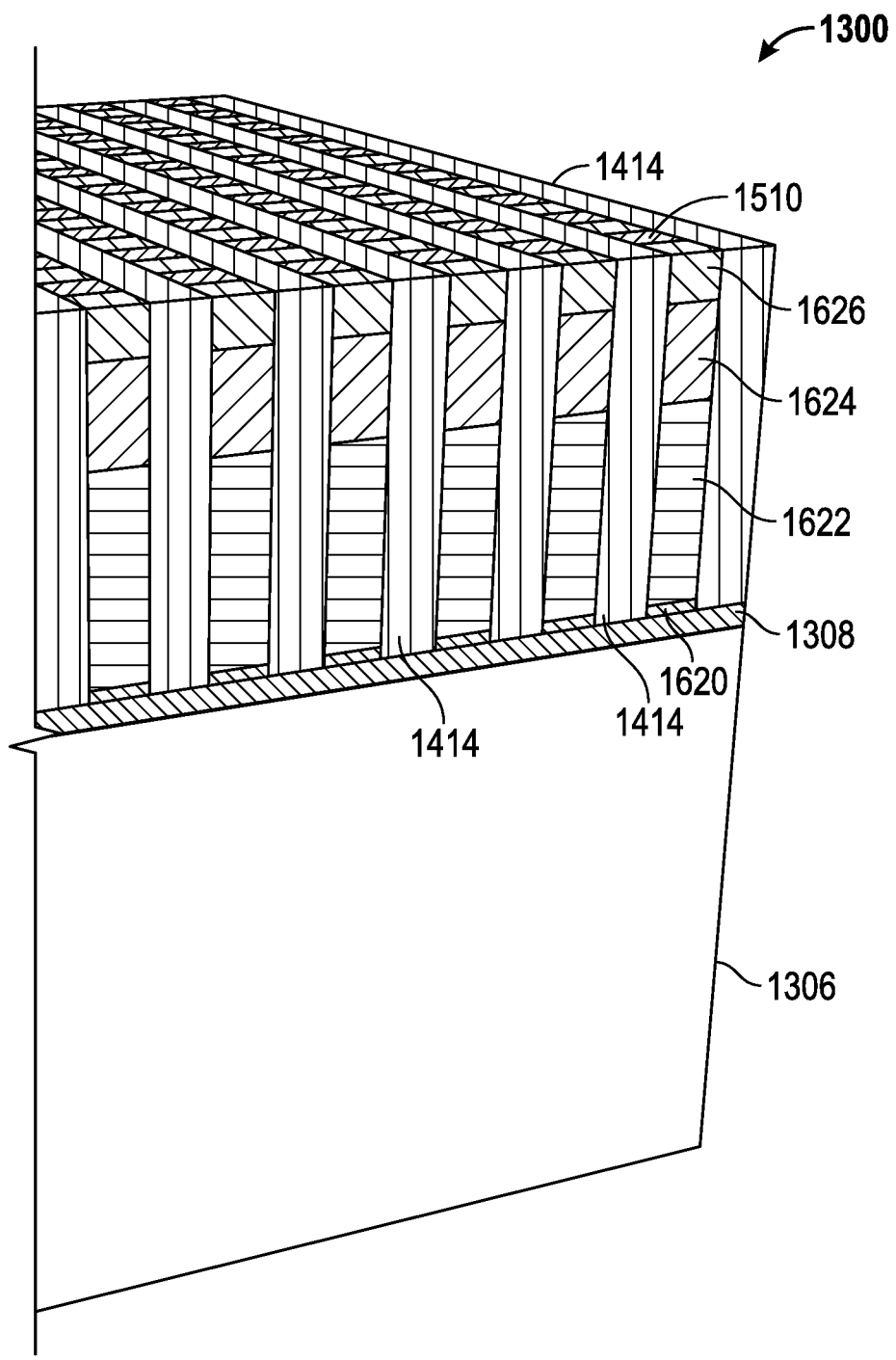
FIG. 16A is a perspective view of a portion of the semiconductor construction shown in FIG. 16 according to various embodiments of the invention.

FIG. 16A is a perspective view of a portion of the semiconductor construction 1300 shown in FIG. 16 according to various embodiments of the invention. FIG. 16A illustrates the substrate 1306, the n-type region 1308, the pillars of silicon nitride 1510, the walls of silicon dioxide 1414, the cathode regions 1620, the pbase regions 1622, the nbase regions 1624 and the anode regions 1626.

Figure 17:
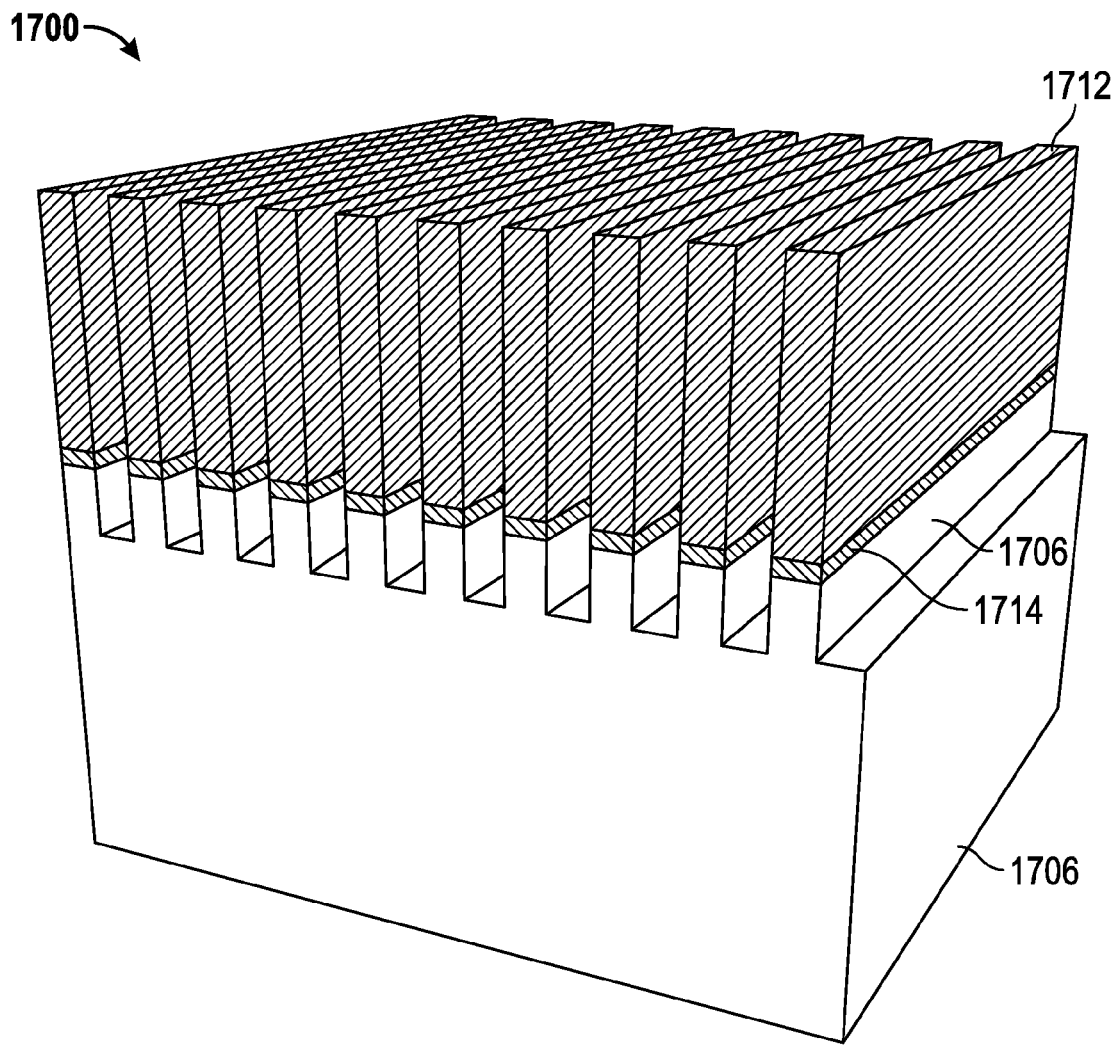
FIG. 17 is a perspective view of an apparatus in the form of a semiconductor construction according to various embodiments of the invention.

FIG. 17 is a perspective view of an apparatus in the form of a semiconductor construction 1700 according to various embodiments of the invention. Elements in the semiconductor construction 1700 will be identified by the same reference numerals throughout the drawings for purposes of brevity and clarity. In addition, acts may be described herein related to the formation of a single array of devices, but the acts may result in the formation of more than one array. Thus, it is understood that the acts described herein may be applied to multiple arrays of devices as well.

The semiconductor construction 1700 includes a substrate 1706 with a region that is doped with an n-type dopant to form an n-type region across one surface of the substrate 1706. The substrate 1706 may comprise silicon and may be further doped with a p-type dopant or an n-type dopant or be undoped. A first dielectric such as silicon nitride is deposited on the n-type region and is etched in a first direction to leave walls of silicon nitride 1712 on the n-type region separated from each other by trenches. The etch does not stop at the n-type region but removes some of the substrate 1706 to leave separate n-type regions 1714 under the walls of silicon nitride 1712.

Figure 18:
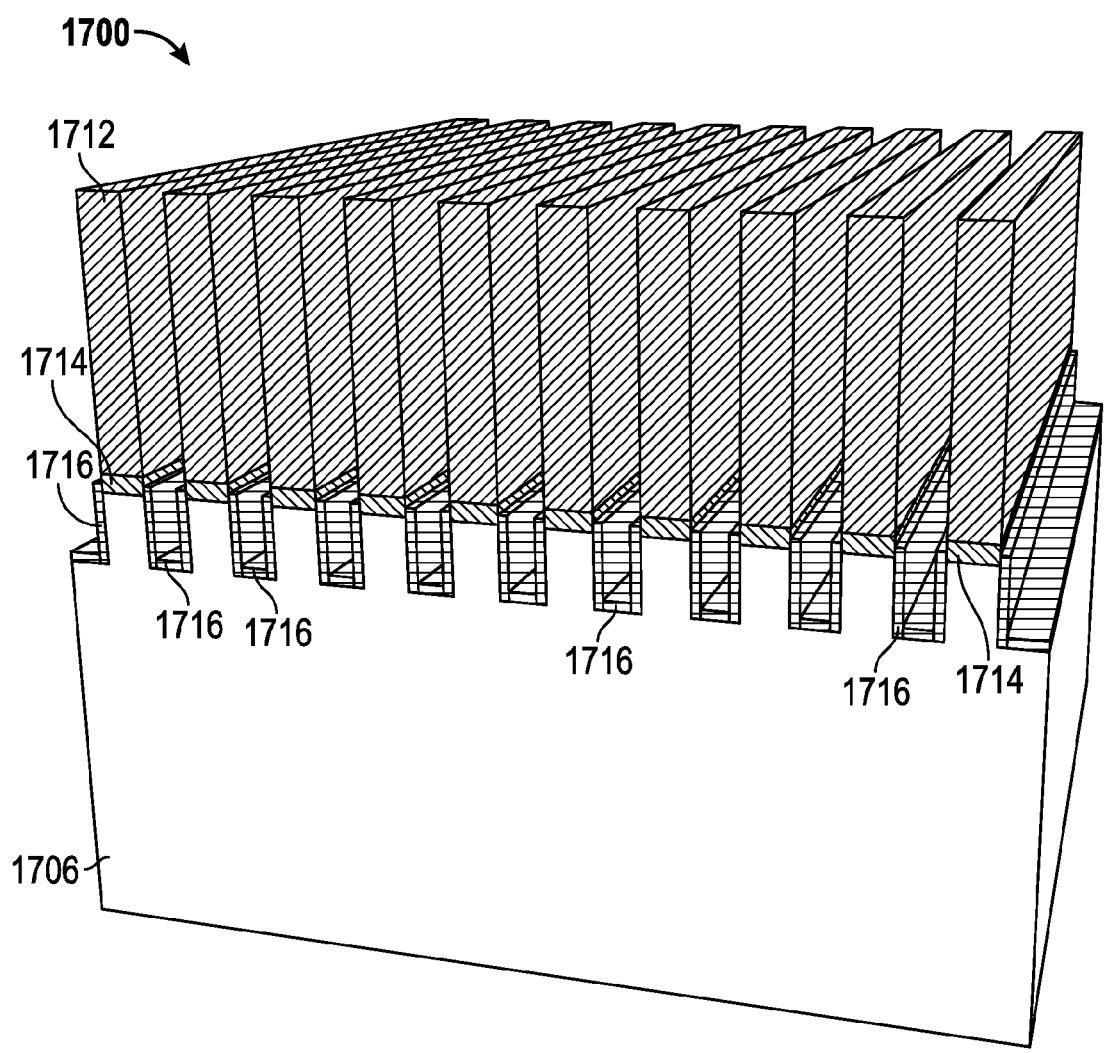
FIGS. 18-21 are perspective views of various stages of a semiconductor construction according to various embodiments of the invention.

FIG. 18 is a perspective view of the semiconductor construction 1700 according to various embodiments of the invention. Conductive electrodes 1716 are formed or deposited in the trenches between the walls of silicon nitride 1712. The electrodes 1716 can be U-shaped and are in contact with the n-type regions 1714 under the walls of silicon nitride 1712 to provide a conductive path between the n-type regions 1714. The electrodes 1716 and the n-type regions 1714 together may comprise a common cathode for thyristors or a source region for MOSFETs.

The electrodes 1716 may comprise one of the following materials: titanium silicide; cobalt silicide; nickel silicide; titanium nitride; titanium with titanium nitride; tantalum nitride; tantalum with tantalum nitride; tungsten; or tungsten silicide. The electrodes 1716 may be formed into shapes other than the U-shape. The trenches between the walls of silicon nitride 1712 can be partially filled or completely filled with the metal and recessed to form the electrodes 1716.

Figure 19:
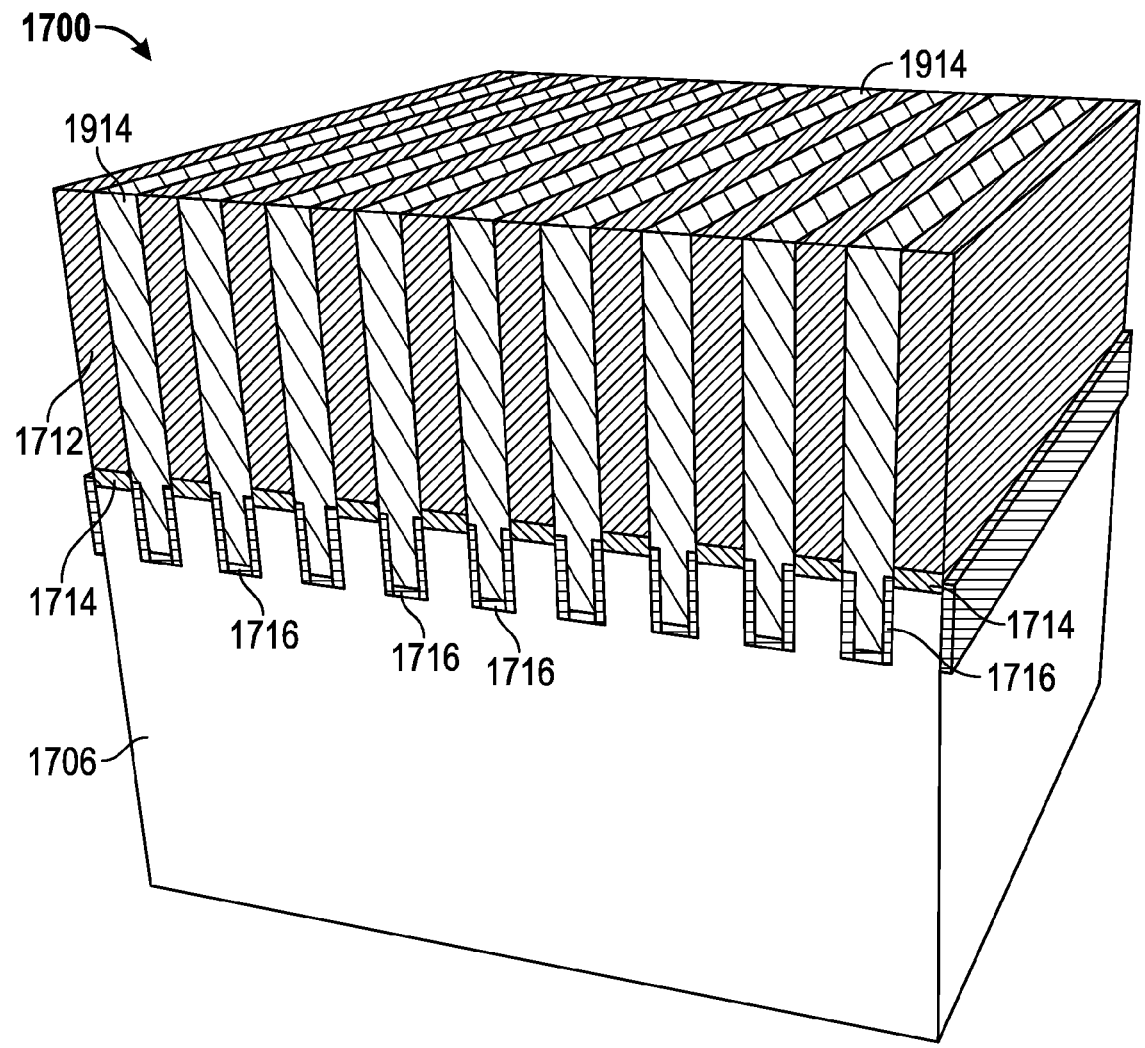

FIG. 19 is a perspective view of the semiconductor construction 1700 according to various embodiments of the invention. The trenches between the walls of silicon nitride 1712 are filled with a second dielectric such as silicon dioxide to form walls of silicon dioxide 1914. The semiconductor construction 1700 can be subjected to planarization such as CMP that stops at the walls of silicon nitride 1712.

Figure 20:
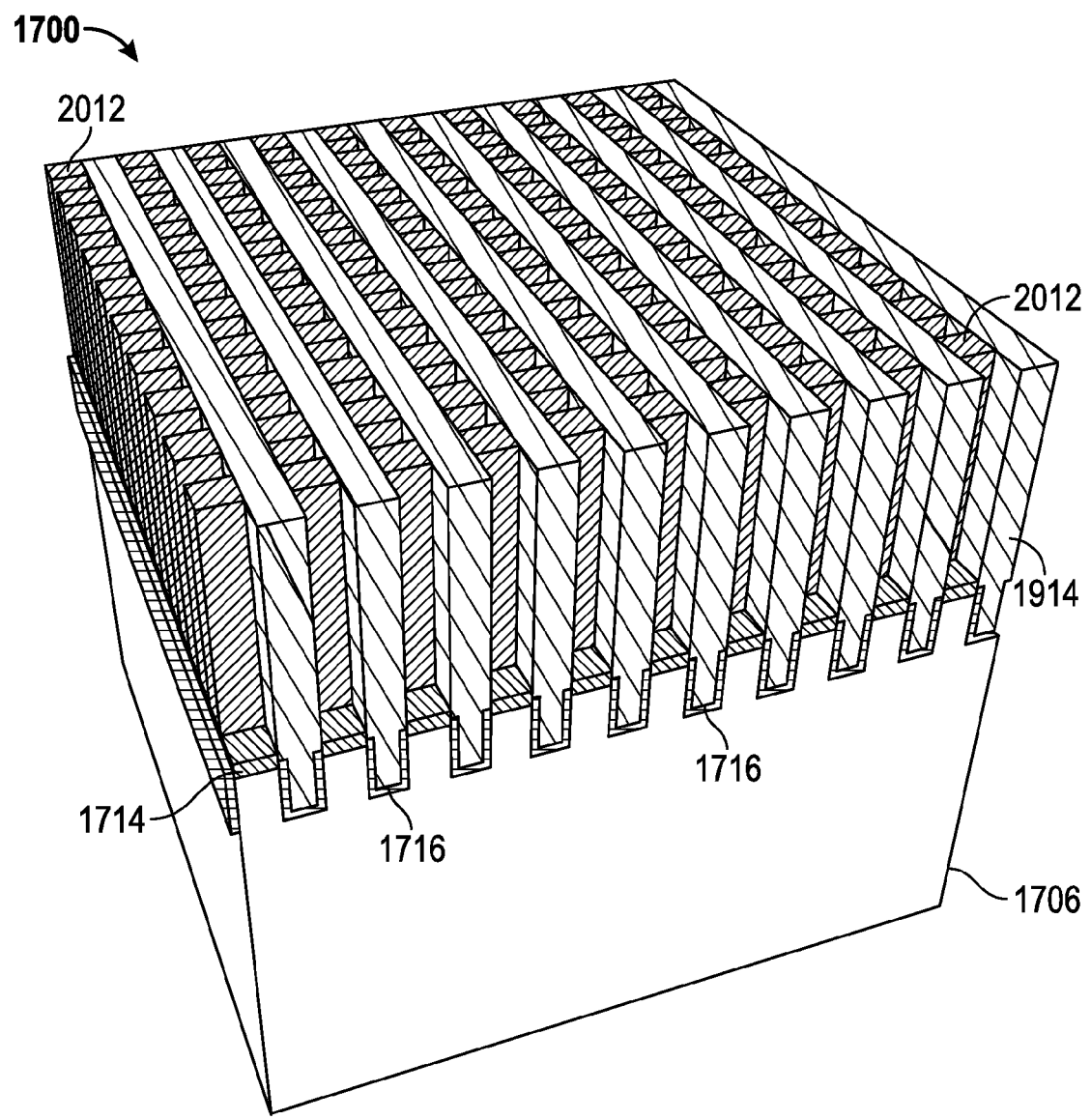

FIG. 20 is a perspective view of the semiconductor construction 1700 according to various embodiments of the invention. The semiconductor construction 1700 in FIG. 20 is rotated 90 degrees with respect to the semiconductor construction 1700 in FIG. 19. A mask (not shown) can be formed (e.g., exposed) over the semiconductor construction 1700, the mask comprising walls separated by trenches that are substantially orthogonal to the walls of silicon nitride 1712. The walls of silicon nitride 1712 are etched to the n-type regions 1714 in areas between the walls of the mask and the walls of silicon dioxide 1914. Portions of the walls of silicon nitride 1712 are removed during the etch, leaving pillars of silicon nitride 2012. The mask is then removed. The walls of silicon dioxide 1914 and the pillars of the silicon nitride 2012 in the trenches between the walls of silicon dioxide 1914 remain following the etch and the removal of the mask. Voids between the walls of silicon dioxide 1914 and the pillars of the silicon nitride 2012 may extend to the n-type regions 1714.

Figure 21:
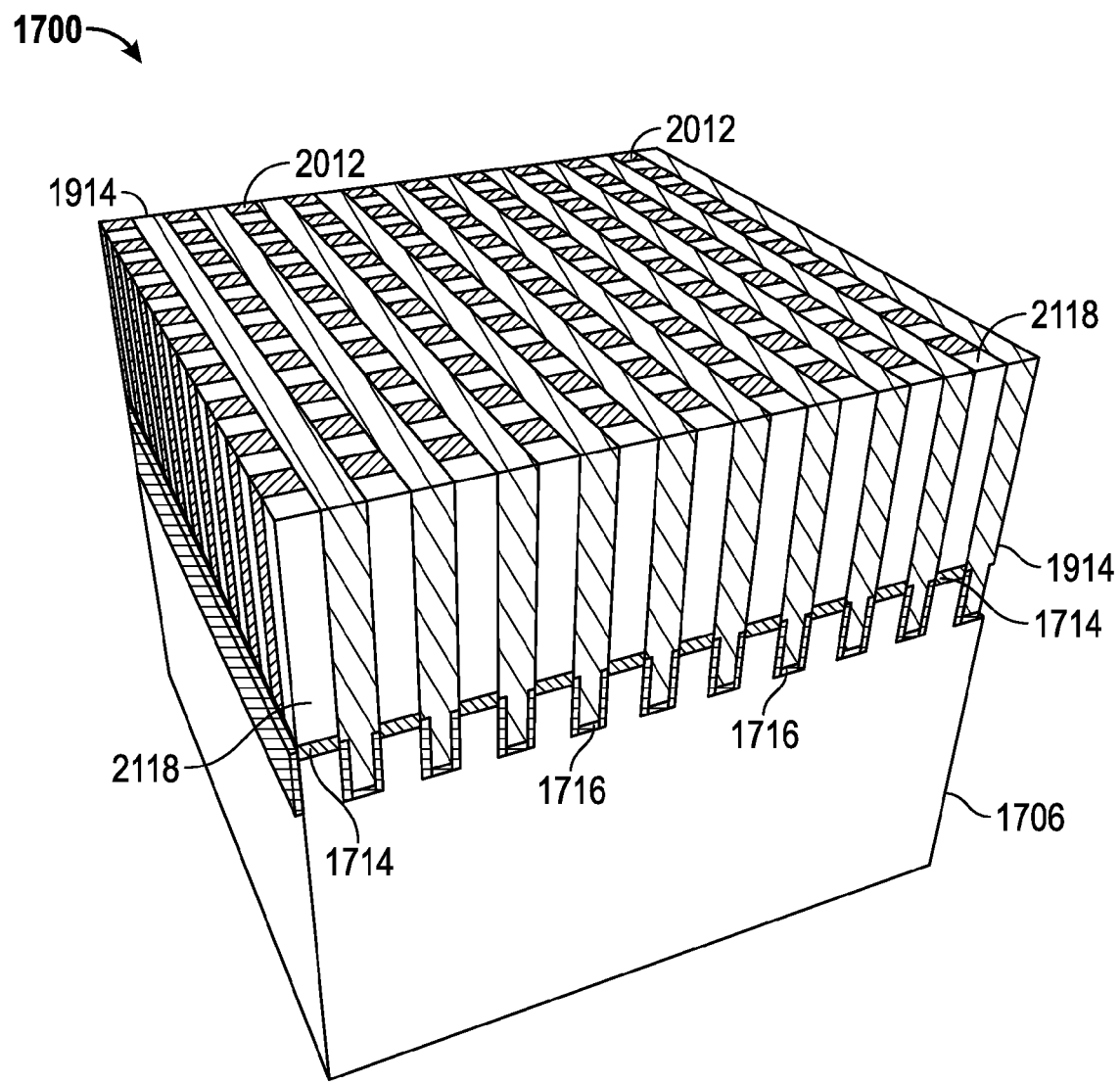

FIG. 21 is a perspective view of the semiconductor construction 1700 according to various embodiments of the invention. Pillars of epitaxial silicon 2118 are grown on the exposed n-type regions 1714 in the voids between walls of silicon dioxide 1914 and the pillars of the silicon nitride 2012. The pillars of epitaxial silicon 2118 may comprise SEG silicon. The growth of the pillars of epitaxial silicon 2118 is self-aligned. The pillars of epitaxial silicon 2118 comprise single-crystal silicon having the same crystal size and orientation as the silicon of the n-type regions 1714.

The pillars of epitaxial silicon 2118 can be undoped. The pillars of epitaxial silicon 2118 can also be doped in situ while being grown (not shown) to form p-type regions and/or n-type regions of vertical thyristors or MOSFETs. The pillars of epitaxial silicon 2118 can also be doped by ion implantation after being formed, or by a mixture of in situ doping and ion implantation. The semiconductor construction 1700 can be subjected to planarization such as CMP that stops at the pillars of silicon nitride 2012. The pillars of epitaxial silicon 2118 are separated from each other by two different dielectric materials, the pillars of silicon nitride 2012 in a first direction and the walls of silicon dioxide 1914 in a second direction.

Figure 22:
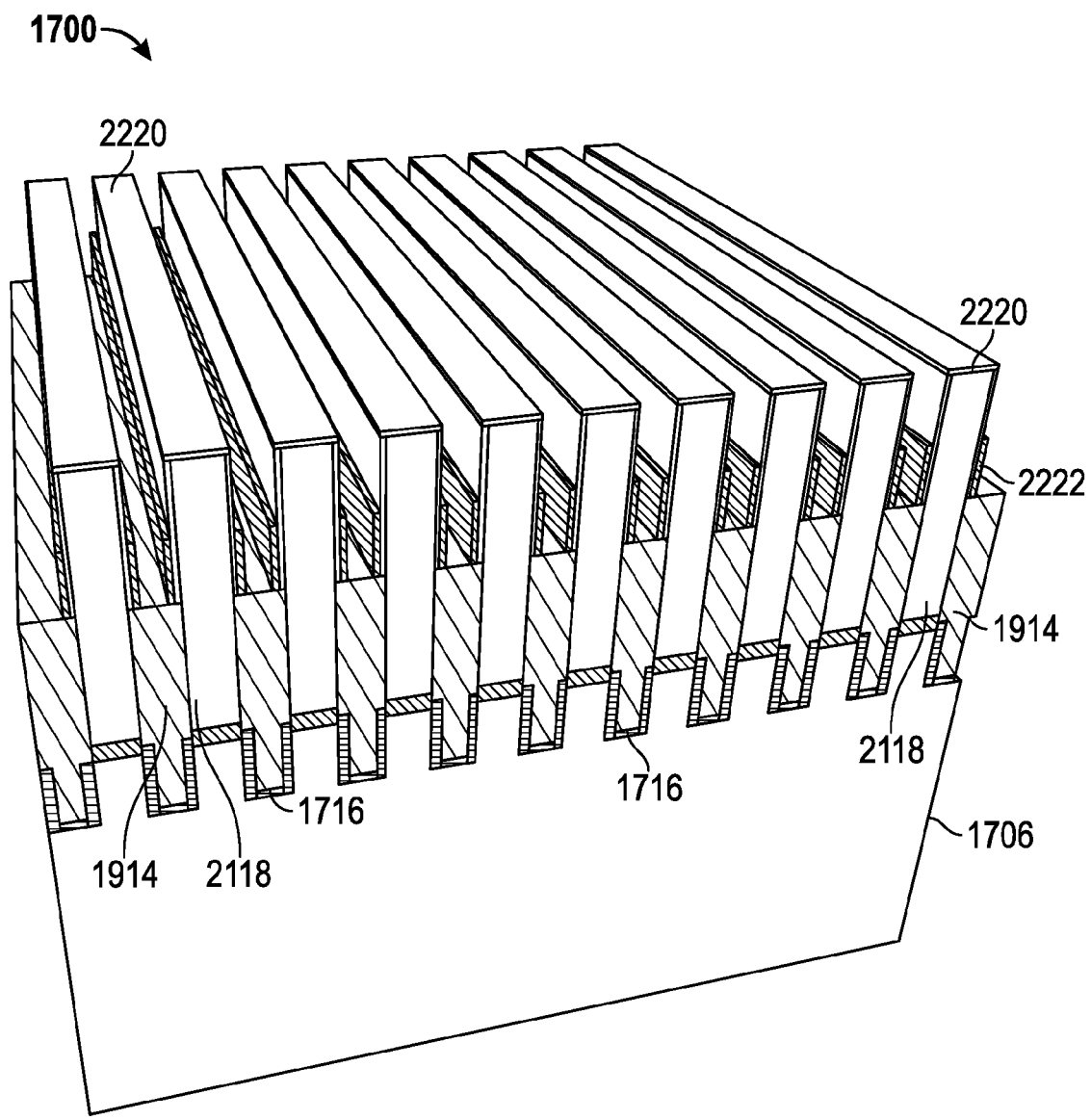
FIG. 22 is a perspective view of a semiconductor construction according to various embodiments of the invention.

FIG. 22 is a perspective view of the semiconductor construction 1700 according to various embodiments of the invention. The walls of silicon dioxide 1914 are recessed by etching to set a position of vertical gates. A gate oxide 2220 is deposited on the pillars of silicon nitride 2012 and the pillars of epitaxial silicon 2118. The gate oxide 2220 may also be thermally grown on the pillars of silicon nitride 2012 and the pillars of epitaxial silicon 2118. The gate oxide 2220 may comprise silicon dioxide. Vertical metal gates 2222 are then formed on the gate oxide 2220 with a spacer etch. A conformal metal is deposited on the gate oxide 2220. The metal may comprise titanium nitride (TiN). A spacer etch removes metal from horizontal surfaces and recesses the metal to leave the vertical metal gates 2222 on the gate oxide 2220. Additional features may be added to the semiconductor construction 1700 similar to those illustrated and described with respect to FIGS. 10-12. The semiconductor construction 1700 shown in FIG. 22 comprises an array of devices that may be vertical thyristors or MOSFETs or other devices according to various embodiments of the invention.

Figure 22A:
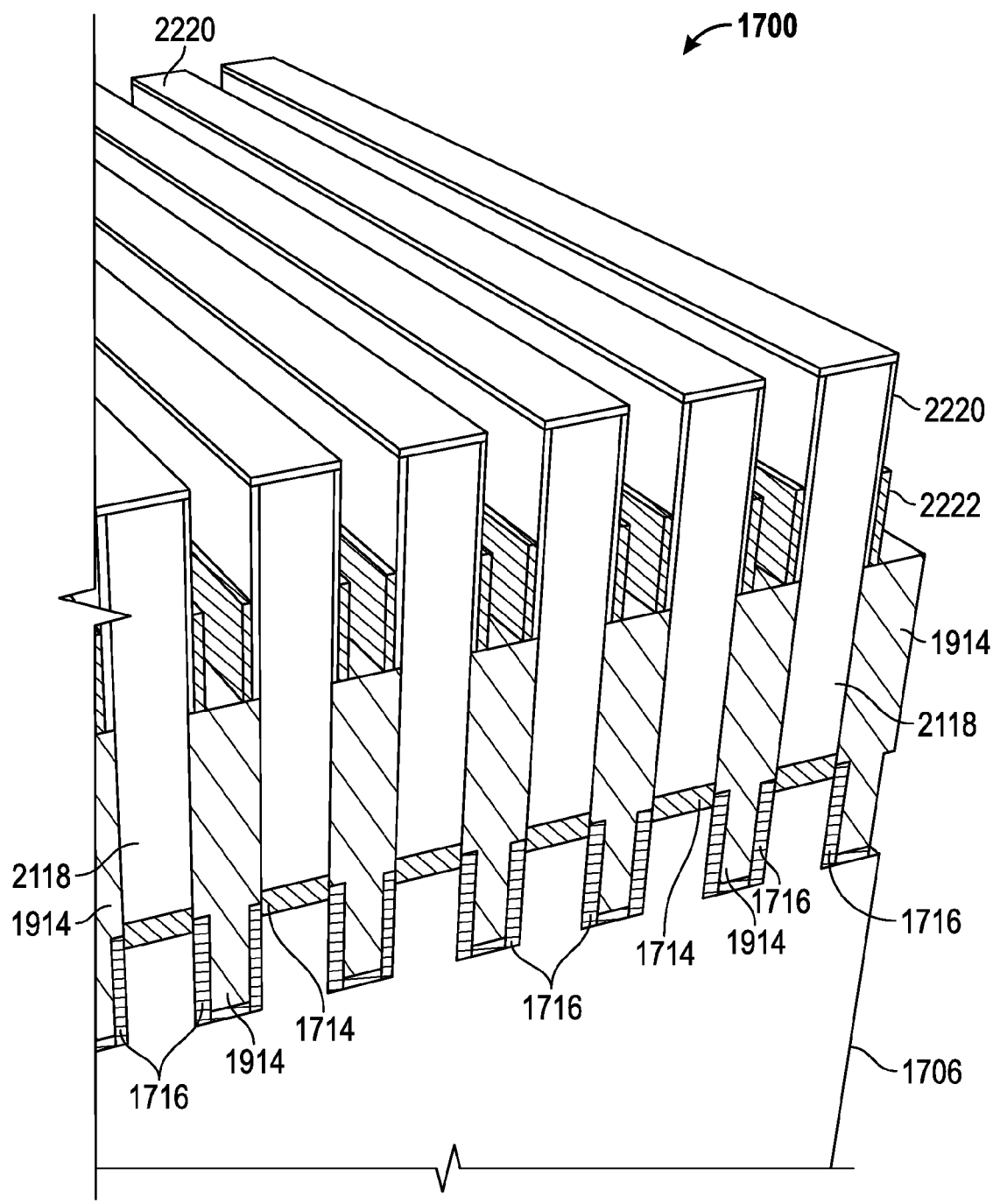
FIG. 22A is a perspective view of a portion of the semiconductor construction shown in FIG. 22 according to various embodiments of the invention.

FIG. 22A is a perspective view of a portion of the semiconductor construction 1700 shown in FIG. 22 according to various embodiments of the invention. FIG. 22A illustrates the substrate 1706, n-type regions 1714, the electrodes 1716, the walls of silicon dioxide 1914, the pillars of epitaxial silicon 2118, the gate oxide 2220 and the vertical metal gates 2222.

All etches described herein may be accomplished by a dry etch or a wet etch. Silicon nitride and silicon dioxide are a suitable pair of dielectrics for use within the semiconductor constructions 100, 1300 and 1700, although other pairs of dielectrics may also be employed according to various embodiments of the invention. For example, silicon nitride and silicon dioxide may be replaced by polysilicon and silicon dioxide, or alumina and silicon dioxide. For each pair of dielectrics, the first dielectric can be etched without etching the second dielectric, and the second dielectric can be etched without etching the first dielectric. The formation and etching of silicon nitride and silicon dioxide may be reversed in time and/or in physical location for each of the semiconductor constructions 100, 1300 and 1700.

Figure 23:
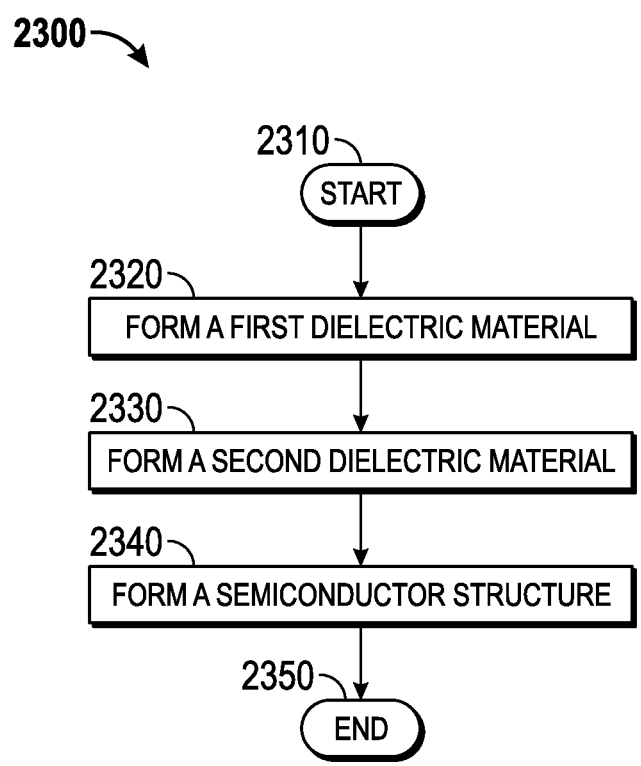
FIG. 23 is a flow diagram of one method according to various embodiments of the invention.

FIG. 23 is a flow diagram of one method 2300 according to various embodiments of the invention. In block 2310, the method 2300 begins. In block 2320, a first dielectric material (which may comprise silicon nitride) is formed on a substrate. First voids are then formed in the first dielectric material. In block 2330, a second dielectric material is formed on the substrate. Second voids are then formed in the first dielectric material or in the second dielectric material. The second dielectric material may comprise silicon dioxide. In block 2340, a semiconductor structure is formed at least partially in each of the second voids. Epitaxial silicon is selectively grown on the substrate to form a pillar of SEG silicon at least partially in each second void. Each pillar of SEG silicon may be in contact with the first dielectric material and the second dielectric material. Each pillar of SEG silicon is doped to form a MOSFET or a vertical thyristor or another device. In block 2350, the method 2300 ends. Various embodiments may have more or fewer activities than those shown in FIG. 23. The activities shown may be accomplished in the illustrated order, or in another order. Some activities may be substituted for others.

Figure 24:
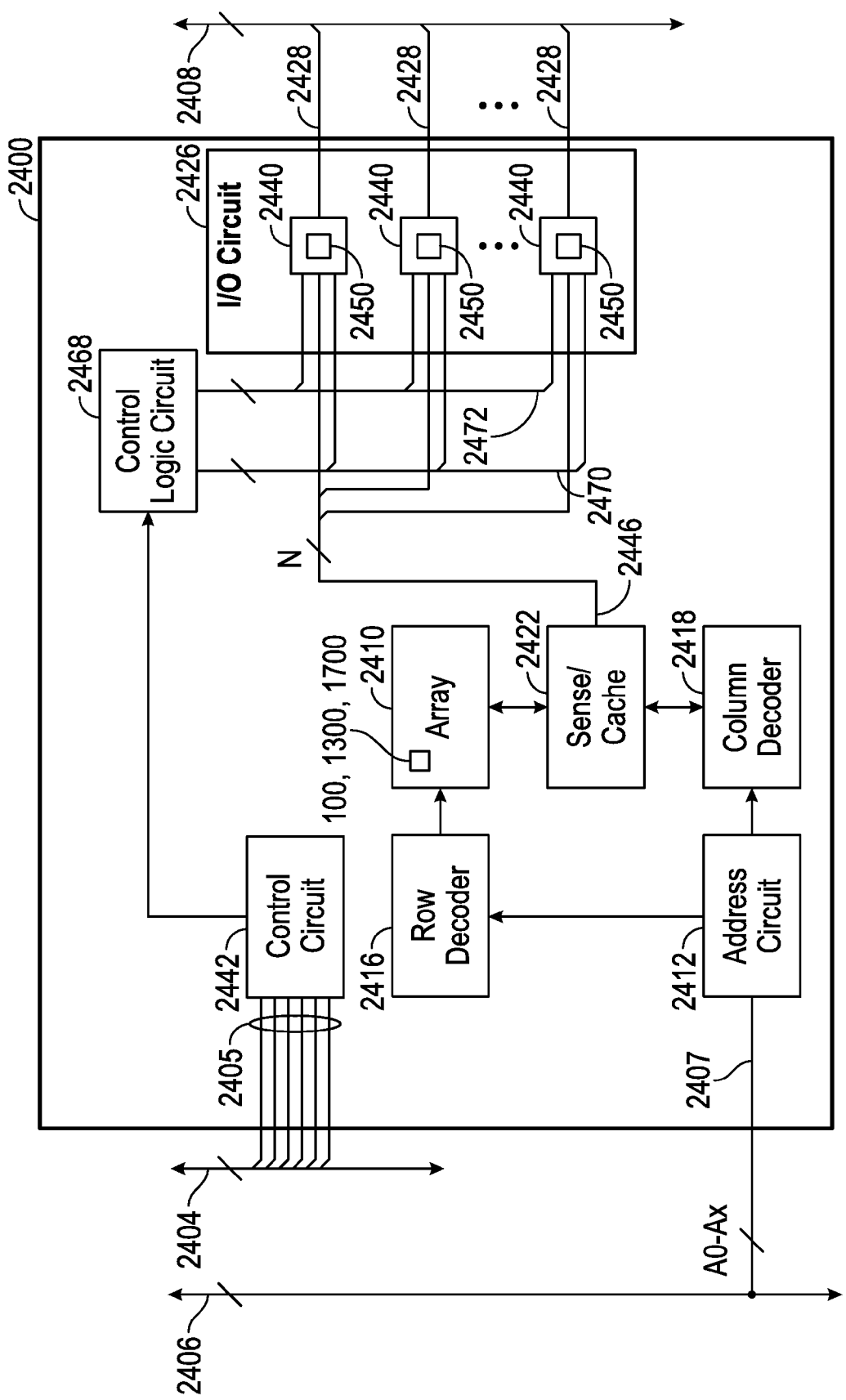
FIG. 24 is a block diagram of an apparatus in the form of a memory device according to various embodiments of the invention.

FIG. 24 is a block diagram of an apparatus in the form of a memory device 2400 according to various embodiments of the invention. The memory device 2400 may be coupled to a processor (not shown) in a system. The memory device 2400 is coupled to a control bus 2404 to receive multiple control signals over control signal lines 2405. The memory device 2400 is also coupled to an address bus 2406 to receive address signals A0-Ax on address signal lines 2407 and to a data bus 2408 to transmit and receive data signals. Although depicted as being received on separate physical busses, the data signals could also be multiplexed and received on the same physical bus.

The memory device 2400 includes one or more arrays 2410 of cells that can be arranged in rows and in columns. The cells of the array 2410 can comprise dynamic random access memory (DRAM) cells or phase change cells or charge storage cells (e.g., Flash memory cells with floating gate transistors or charge trap transistors) according to various embodiments of the invention. The memory device 2400 may comprise a NOT AND (NAND) memory device. The array 2410 can include multiple banks and blocks of cells residing on a single die or on multiple dice as part of the memory device 2400. The cells in the array 2410 can be single level cell (SLC) or multilevel cell (MLC) cells, or combinations thereof. The array 2410 can include one or more of the semiconductor constructions 100, 1300 and 1700 shown in FIGS. 1-22 according to various embodiments of the invention.

An address circuit 2412 can latch the address signals A0-Ax received on the address signal lines 2407. The address signals A0-Ax can be decoded by a row decoder 2416 and a column decoder 2418 to access data stored in the array 2410. The memory device 2400 can read data in the array 2410 by sensing voltage or current changes in cells in the array 2410 using sense devices in a sense/cache circuit 2422.

A data input and output (I/O) circuit 2426 implements bi-directional data communication over external (e.g., data I/O) nodes 2428 coupled to the data bus 2408. The I/O circuit 2426 includes N driver and receiver circuits 2440 according to various embodiments of the invention. The memory device 2400 includes a controller that is configured to support operations of the memory device 2400, such as writing data to and/or erasing data from the array 2410. The controller can comprise, for example, control circuitry 2442 (e.g., configured to implement a state machine) on a same or different die than that which includes the array 2410 and/or any or all of the other components of the memory device 2400. The controller can comprise the control circuitry 2442, firmware, software or combinations of any or all of the foregoing. Data can be transferred between the sense/cache circuit 2422 and the I/O circuit 2426 over N signal lines 2446. A memory request can be received in the control signals and the address signals A0-Ax and can be executed by the controller.

Each driver and receiver circuit 2440 can include a driver circuit 2450. Control signals can be provided to the driver circuits 2450 (e.g., through control logic circuit 2468 that is coupled to the control circuitry 2442). The control logic circuit 2468 can provide the control signals over lines 2470 and 2472 to the driver circuits 2450.

The vertical devices described herein, such as thyristors or MOSFETs with vertical gates, are formed by etching different materials at different times, and forming a semiconductor structure at least partially between the etched materials. Various embodiments formed in this way can offer improved performance for vertical devices, when compared to devices formed in a more conventional manner.

Example apparatuses and methods of forming semiconductor constructions have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
   forming a first dielectric material on a substrate;
   removing a portion of the first dielectric material to leave a remainder of the first dielectric material on the substrate;
   forming a second dielectric material on the substrate in contact with the remainder of the first dielectric material;
   removing a portion of the second dielectric material to leave a remainder of the second dielectric material in contact with the remainder of the first dielectric material;
   forming a vertical semiconductor structure in contact with the remainder of the first dielectric material and the remainder of the second dielectric material;
   forming a gate dielectric material on the remainder of the second dielectric material, a side of the vertical semiconductor structure, and a side of the remainder of the first dielectric material;
   forming a vertical gate material on a first portion of the gate dielectric material formed on the side of the vertical semiconductor structure and on the ate dielectric material formed on the remainder of the second dielectric material; and
   forming a third dielectric material on a second portion of the gate dielectric material on the side of the vertical semiconductor structure.

2. The method of claim 1, further comprising:
   forming the third dielectric material between the vertical gate material and a second vertical gate material formed on a side of an adjacent vertical semiconductor structure.

3. The method of claim 1, wherein removing a portion of the second dielectric material further comprises etching the second dielectric material to remove the portion of the second dielectric material.

4. The method of claim 1, wherein forming the first dielectric material further comprises forming silicon nitride.

5. The method of claim 1, wherein forming the second dielectric material further comprises forming silicon dioxide.

6. The method of claim 1, wherein removing a portion of the first dielectric material further comprises etching the first dielectric material.

7. The method of claim 1, wherein forming the vertical semiconductor structure further comprises forming a vertical silicon structure in contact with the remainder of the first dielectric material and the remainder of the second dielectric material.

8. A method comprising:
   forming a first dielectric material on a substrate;
   etching the first dielectric material to form a first void in the first dielectric material;
   forming a second dielectric material in the first void in the first dielectric material;
   etching the first dielectric material to form a second void extending to the second dielectric material;
   forming a vertical semiconductor device at least partially in the second void;
   wherein forming the vertical semiconductor device comprises:
      forming a semiconductor pillar in the second void;
      forming a vertical gate material over a first portion of a side of the semiconductor pillar and over the second dielectric material; and
      forming a dielectric material on the vertical gate material and on a second portion of the side of the semiconductor pillar.

9. The method of claim 8, wherein:
   etching the first dielectric material to form a first void further comprises etching the first dielectric material to form a plurality of first voids in the first dielectric material; and
   etching the first dielectric material to form a second void further comprises etching the first dielectric material to form a plurality of second voids extending to the second dielectric material; and
   forming the vertical device further comprises forming a respective vertical device at least partially in each of the second voids.

10. The method of claim 8, wherein forming the vertical device further comprises selectively growing epitaxial silicon on the substrate to form a pillar of selective epitaxial grown silicon.

11. The method of claim 8, wherein forming the vertical device further comprises forming a metal oxide semiconductor field effect transistor at least partially in the second void.

12. The method of claim 8, wherein forming the vertical device further comprises forming a vertical thyristor at least partially in the second void.

13. The method of claim 8, wherein:
   etching the first dielectric material further comprises wet etching or dry etching silicon nitride; and
   etching the second dielectric material further comprises wet etching or dry etching silicon dioxide.

14. A method comprising:
   forming a first dielectric material on a substrate;
   forming a second dielectric material on the substrate or on the first dielectric material; and
   growing epitaxial semiconductor material on the substrate in contact with the first dielectric material and the second dielectric material to form a vertical device, wherein forming the vertical device comprises:

forming a gate oxide on a side of the semiconductor material and on the second dielectric material;

forming a vertical metal gate material on the gate oxide of a first portion of the side of the semiconductor material and on the ate oxide of the second dielectric material; and forming a dielectric material on the vertical metal gate material and on the gate oxide of a second portion of the side of the semiconductor pillar.

15. The method of claim 14, wherein growing epitaxial semiconductor material further comprises doping the epitaxial semiconductor material as it is being grown.

16. The method of claim 14, wherein growing epitaxial semiconductor material further comprises selectively growing epitaxial silicon to form a pillar of selective epitaxial grown (SEG) silicon on the substrate.

17. The method of claim 14, wherein growing epitaxial semiconductor material further comprises growing the epitaxial semiconductor material to be self-aligned with the first dielectric material and the second dielectric material.

18. The method of claim 14, further comprising:
etching the first dielectric material without etching the second dielectric material; and
etching the second dielectric material without etching the first dielectric material.

19. The method of claim 18, wherein etching the second dielectric material further comprises etching the second dielectric material with a self-aligned etch.

20. The method of claim 14, wherein growing epitaxial semiconductor material further comprises growing the epitaxial semiconductor material on the substrate in contact with the first dielectric material in a first direction and in contact with the second dielectric material in a second direction.

21. The method of claim 14, wherein:
forming the first dielectric material further comprises forming silicon dioxide on the substrate; and
forming the second dielectric material further comprises forming polysilicon on the substrate.

22. The method of claim 14, wherein:
forming the first dielectric material further comprises forming silicon dioxide on the substrate; and
forming the second dielectric material further comprises forming alumina on the substrate.

23. The method of claim 14, wherein:
forming the first dielectric material further comprises forming silicon nitride on the substrate; and forming the second dielectric material further comprises forming silicon dioxide on the substrate.

24. A method comprising:
forming a first dielectric material on a substrate;
etching the first dielectric material to form a plurality of first voids in the first dielectric material;
forming a second dielectric material in the first voids in the first dielectric material;
etching the second dielectric material to form a plurality of second voids extending to the first dielectric material and extending to the second dielectric material; and
forming a vertical device at least partially in each of the second voids, wherein forming the vertical devices comprises:
forming a silicon pillar in the second voids;
forming a gate oxide on a sidewall of the silicon pillar and on the second dielectric material;
forming a vertical metal gate material on the gate oxide of a first portion of the sidewall of the semiconductor material and on the gate oxide of the second dielectric material;
forming a third dielectric material on the vertical metal gate material and on the gate oxide of a second portion of the sidewall of the semiconductor pillar;
forming the third dielectric material between the vertical metal gate material of adjacent vertical devices; and
forming a fourth dielectric material on the third dielectric material between the adjacent vertical devices and on the third dielectric material between the vertical metal gate material of adjacent vertical devices.

25. The method of claim 24, wherein:
etching the first dielectric material to form the plurality of first voids further comprises etching silicon nitride to form the plurality of first voids in the silicon nitride; and
etching the second dielectric material to form the plurality of second voids further comprises etching silicon dioxide to form the plurality of second voids extending to the silicon nitride and extending to the silicon dioxide; and
forming the silicon pillar further comprises selectively growing epitaxial silicon on the substrate to form the pillar of selective epitaxial grown silicon in each of the second voids.

26. The method of claim 24, wherein forming the vertical device further comprises forming a metal oxide semiconductor field effect transistor or a thyristor at least partially in each second void.

* * * * *